(12) United States Patent
Park

(10) Patent No.: US 9,978,787 B1
(45) Date of Patent: May 22, 2018

(54) IMAGE SENSOR AND METHOD FOR FABRICATING THE SAME

(71) Applicant: SK hynix Inc., Gyeonggi-do (KR)

(72) Inventor: Sung-Kun Park, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/671,662

(22) Filed: Aug. 8, 2017

(30) Foreign Application Priority Data

Jan. 19, 2017 (KR) .......................... 10-2017-0009151

(51) Int. Cl.
*H01L 27/146* (2006.01)

(52) U.S. Cl.
CPC .. *H01L 27/14616* (2013.01); *H01L 27/14645* (2013.01); *H01L 27/14689* (2013.01); *H01L 27/14698* (2013.01); *H01L 27/14621* (2013.01); *H01L 27/14627* (2013.01)

(58) Field of Classification Search
CPC ......... H01L 27/14616; H01L 27/14645; H01L 27/14689; H01L 27/14698; H01L 27/14621; H01L 27/14627
See application file for complete search history.

(56) References Cited

U.S. PATENT DOCUMENTS

2014/0175381 A1* 6/2014 Goh .................. H01L 29/66545
257/39

FOREIGN PATENT DOCUMENTS

KR 1020100133212 12/2010

\* cited by examiner

*Primary Examiner* — Karen Kusumakar
(74) *Attorney, Agent, or Firm* — IP & T Group LLP

(57) ABSTRACT

An image sensor includes a substrate including a photoelectric conversion element; a transfer gate formed over the photoelectric conversion element; and a channel layer controlled by the transfer gate, wherein the channel layer includes a first region which is in contacts with the photoelectric conversion element and a second region which is separated from the photoelectric conversion element, and the first region and the second region have different crystalline states from each other.

29 Claims, 17 Drawing Sheets

IMAGE SENSOR AND METHOD FOR FABRICATING THE SAME

CROSS-REFERENCE TO RELATED APPLICATION

This application claims priority under 35 U.S.C. § 119 to Korean Patent Application No. 10-2017-0009151 filed on Jan. 19, 2017 in the Korean Intellectual Property Office, the disclosure of which is incorporated herein by reference in its entirety.

TECHNICAL FIELD

Various embodiments generally relate to a semiconductor device fabrication technology and, more particularly, to an image sensor and a method for fabricating the same.

DISCUSSION OF THE RELATED ART

An image sensor converts an optical image into electrical signals. Recently, with the development of the computer and communication industries, demand for an image sensor having an improved degree of integration and enhanced performance is increasing in various technical fields such as in the fields of digital cameras, camcorders, PCS (personal communication systems), game machines, security cameras, medical micro-cameras and robots.

SUMMARY

Various embodiments of the present invention are directed to an image sensor with improved performance and a method for fabricating the same.

In an embodiment, an image sensor may include: a substrate including a photoelectric conversion element; a transfer gate formed over the photoelectric conversion element; and a channel layer controlled by the transfer gate, wherein the channel layer includes a first region which is brought into contact with the photoelectric conversion element and a second region which is separated from the photoelectric conversion element, and the first region and the second region have different crystalline states.

The first region may have a single crystalline state, and the second region may have a polycrystalline state. The substrate may have a single crystalline state, and a crystal plane of the first region may be the same as a crystal plane of a surface of the substrate. The channel layer may further include a third region which is positioned between the first region and the second region, and the third region may have a single crystalline state and may have a crystal plane which is different from the crystal plane of the first region.

The photoelectric conversion element may have a shape in which a first impurity region and a second impurity region formed in the substrate and having different conductivity types are stacked vertically, the first region of the channel layer may be brought into contact with the first impurity region, and the first impurity region may have an impurity doping concentration lower than a saturated solids solubility for the impurity in the substrate. The channel layer may include any one selected among an undoped silicon layer, a P-type silicon layer and an N-type silicon layer.

In an embodiment, an image sensor may include: a substrate including a photoelectric conversion element; a first transfer gate formed over the photoelectric conversion element; at least one opening exposing the photoelectric conversion element through the first transfer gate; a channel layer formed in the opening; and a second transfer gate formed over the channel layer and filling the opening, wherein the channel layer includes a first region which is formed over a bottom surface of the opening and is brought into contact with the photoelectric conversion element and a second region which is formed over a sidewall of the opening and is separated from the photoelectric conversion element, and the first region and the second region have different crystalline states.

The first region may have a single crystalline state, and the second region may have a polycrystalline state. The substrate may have a single crystalline state, and a crystal plane of the first region may be the same as a crystal plane of a surface of the substrate. The channel layer may further include a third region which is positioned between the first region and the second region, and the third region may have a single crystalline state and may have a crystal plane which is different from the crystal plane of the first region. The third region of the channel layer may be formed at a corner of the bottom surface of the opening.

The photoelectric conversion element may have a shape in which a first impurity region and a second impurity region formed in the substrate and having different conductivity types are stacked vertically, the first region of the channel layer may be brought into contact with the first impurity region, and the first impurity region may have an impurity doping concentration lower than a saturated solids solubility for the impurity in the substrate. The channel layer may include any one selected among an undoped silicon layer, a P-type silicon layer and an N-type silicon layer.

In an embodiment, an image sensor may include: a substrate including a photoelectric conversion element; at least one pillar formed over the photoelectric conversion element; a channel layer covering the photoelectric conversion element and the pillar; a transfer gate formed over the channel layer to surround a sidewall of the pillar; and an opening exposing the channel layer through the transfer gate, wherein the channel layer includes a first region which is formed over the substrate and is brought into contact with the photoelectric conversion element and a second region which covers the pillar and is separated from the photoelectric conversion element, and the first region and the second region have different crystalline states.

The first region may have a single crystalline state, and the second region may have a polycrystalline state. The substrate may have a single crystalline state, and a crystal plane of the first region may be the same as a crystal plane of a surface of the substrate. The channel layer may further include a third region which is positioned between the first region and the second region, and the third region may have a single crystalline state and may have a crystal plane which is different from the crystal plane of the first region. The third region of the channel layer may be formed at a corner of the pillar where the pillar and the substrate are brought into contact with each other.

The opening may expose the second region of the channel layer. The photoelectric conversion element may have a shape in which a first impurity region and a second impurity region formed in the substrate and having different conductivity types are stacked vertically, the first region of the channel layer may be brought into contact with the first impurity region, and the first impurity region may have an impurity doping concentration lower than a saturated solids solubility for the impurity in the substrate. The channel layer may include any one selected among an undoped silicon layer, a P-type silicon layer and an N-type silicon layer.

In an embodiment, a method for fabricating an image sensor may include: forming a photoelectric conversion element in a substrate; forming a pre-channel layer which includes a first region brought into contact with the photoelectric conversion element and a second region separated from the photoelectric conversion element and has an amorphous state, over the substrate including the photoelectric conversion element; and forming a channel layer by performing a low temperature annealing process for the pre-channel layer, in such a manner that the first region and the second region have different crystalline states.

In the forming the photoelectric conversion element in the substrate, the photoelectric conversion element may be formed to have a shape in which a first impurity region and a second impurity region having different conductivity types are stacked vertically in the substrate, and the first impurity region which is brought into contact with the first region of the channel layer may be formed to have an impurity doping concentration lower than a saturated solids solubility for the impurity in the substrate. The forming of the pre-channel layer may be performed at a temperature lower than the low temperature annealing process. The low temperature annealing process may be performed at a temperature ranging from about 550° C. to about 600° C.

In the low temperature annealing process, the first region may be recrystallized from an amorphous state to a single crystalline state, and the second region may be recrystallized from an amorphous state into a polycrystalline state. The substrate may have a single crystalline state, and a crystal plane of the first region may be the same as a crystal plane of a surface of the substrate. The channel layer may further include a third region which is positioned between the first region and the second region, and the third region may have a single crystalline state and may have a crystal plane which is different from the crystal plane of the first region. The channel layer may include any one selected among an undoped silicon layer, a P-type silicon layer and an N-type silicon layer.

DETAILED DESCRIPTION

Figure 1:
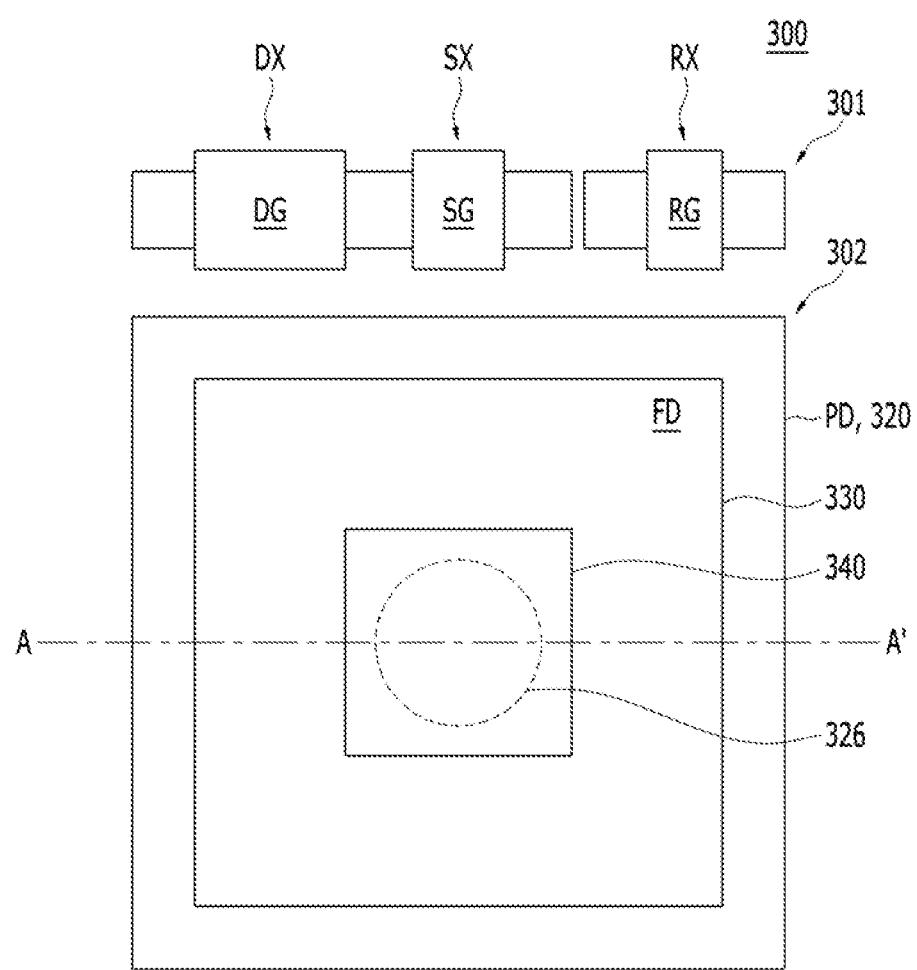
FIGS. 1 and 2 illustrate an image sensor in accordance with an embodiment.

Various embodiments of the present invention will be described below in more detail with reference to the accompanying drawings. The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The following embodiments are examples of an image sensor with improved performance and a method for fabricating the same. Improved performance includes providing a high-resolution image. For ensuring that a maximum number of unit pixels are integrated within a limited area, the image sensor preferably may have a three-dimensional structure. In an embodiment, the image sensor may have a three-dimensional structure in which a transfer transistor having a vertical transfer gate and a photoelectric conversion element are stacked.

Figure 2:
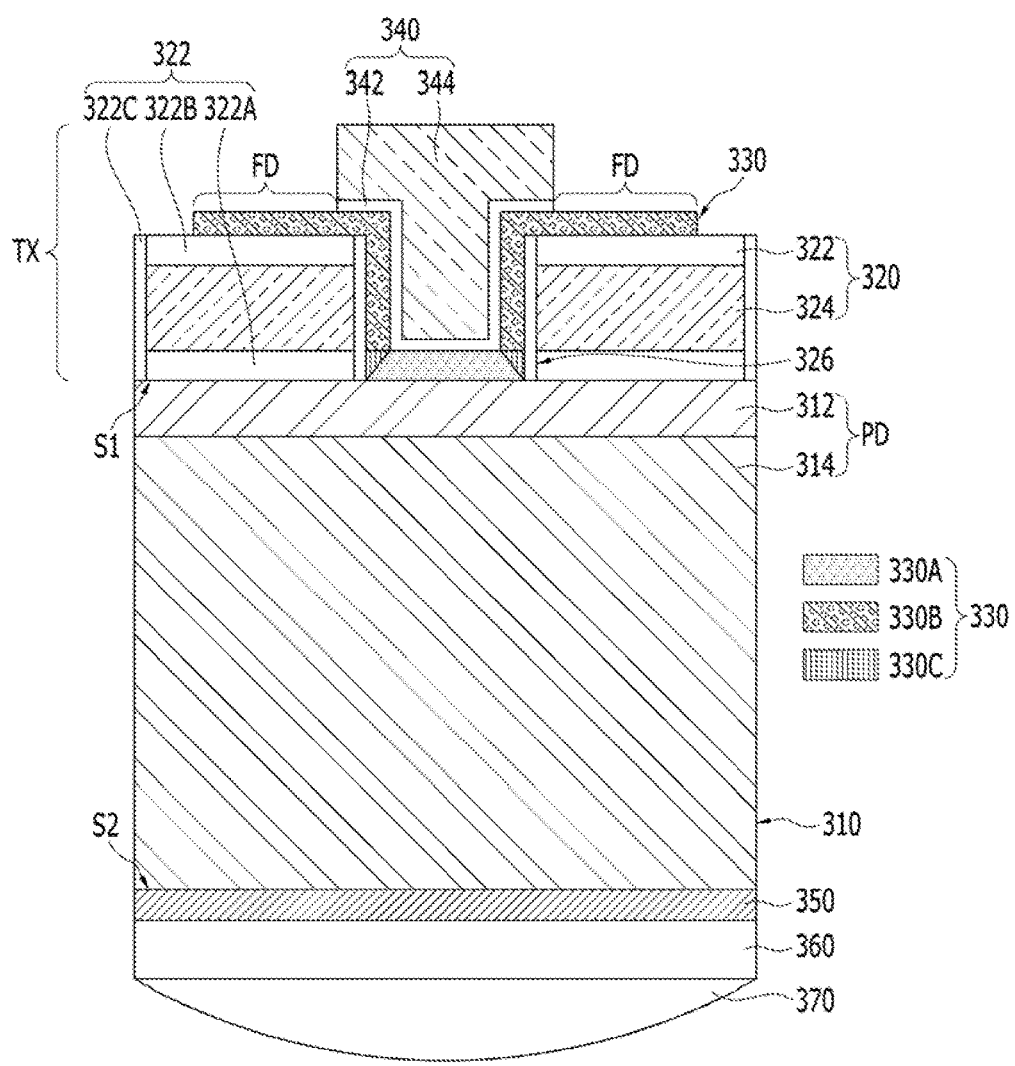

FIGS. 1 and 2 illustrate an image sensor in accordance with a first embodiment. For example, FIG. 1 is a plan view, and FIG. 2 is a cross-sectional view taken along line A-A' of FIG. 1.

As shown in FIGS. 1 and 2, the image sensor in accordance with the first embodiment may include a pixel array, and the pixel array may include a plurality of unit pixels 300 which are arranged in a matrix structure. Each of the plurality of unit pixels 300 may include a light receiving unit 302 which generates photocharges in response to incident light, and a driving unit 301 which outputs an image signal corresponding to the photocharges generated in the light receiving unit 302. The driving unit 301 may include a reset transistor RX, a driver transistor DX and a selection transistor SX. For reference, while not shown in the drawing, the light receiving unit 302 and the driving unit 301 may be electrically isolated by an isolation structure. The isolation structure may include at least one of an STI (shallow trench isolation) region, a DTI (deep trench isolation) region and an impurity region. In an embodiment, the isolation structure may be constructed by a combination of an STI region, and the DTI region or the impurity region.

The light receiving unit 302 may include a photoelectric conversion element PD which generates photocharges in response to the incident light, and a transfer transistor TX which transfers the photocharges generated in the photoelectric conversion element PD, to a floating diffusion FD in response to a transfer signal.

The photoelectric conversion element PD may include an organic or an inorganic photodiode. For example, the photoelectric conversion element PD may have a shape in which a first impurity region 312 and a second impurity region 314 having complementary conductivity types are formed in a substrate 310 and are stacked in a vertical direction. The first impurity region 312 may be a P-type impurity region, and form a first surface S1 of the substrate 310. An impurity doping concentration of the first impurity region 312 may be lower than the saturated solids solubility for the impurity in the substrate 310. This may prevent an impurity in the first impurity region 312, for example, a P-type impurity, from diffusing to a channel layer 330 in a process for forming the channel layer 330. The second impurity region 314 may be an N-type impurity region, and may have a thickness larger than the first impurity region 312. In the vertical direction, the second impurity region 314 may have a uniform doping concentration profile or an increasing doping concentration profile where the impurity concentration increases gradually in a charge moving direction. The charge moving direction refers to the direction in which electrical charges move from the photoelectric conversion element PD to the transfer transistor TX. In other words, the charge moving direction may be a direction from a second surface S2 to the first surface S1 of the substrate 310 (S2→S1). The second surface S2 of the substrate 310 is an incident surface through which incident light is introduced into the photoelectric conversion element PD.

The substrate 310 may include any suitable semiconductor substrate. The semiconductor substrate may be a single crystalline state, and may include a silicon-containing material. In an embodiment, the substrate 310 may include a single crystalline, silicon-containing material. The first surface S1 and the second surface S2 of the substrate 310 in the single crystalline state may have crystal planes expressed by Miller indices. For instance, the crystal planes of the first surface S1 and the second surface S2 of the substrate 310 may have a Miller index of (100). The substrate 310 may be a substrate which is thinned through a thinning process or a substrate which includes an epitaxial layer formed through an epitaxial growth. For instance, the substrate 310 may be a bulk silicon substrate which is thinned through a thinning process.

The transfer transistor TX may include a first transfer gate 320 which is formed on the photoelectric conversion element PD, at least one opening 326 which exposes the photoelectric conversion element PD through the first transfer gate 320, the channel layer 330 which is formed in the opening 326, and a second transfer gate 340 which is formed on the channel layer 330 and fills at least the opening 326.

The first transfer gate 320 may have a shape which is formed on the first surface S1 of the substrate 310 including the photoelectric conversion element PD and overlaps vertically with the photoelectric conversion element PD. Because the first transfer gate 320 is formed on the first surface S1 away from the incident surface through which incident light is introduced into the photoelectric conversion element PD, that is, the second surface S2 of the substrate 310, the first transfer gate 320 may serve as a backside reflection layer for incident light passing through the photoelectric conversion element PD. As the first transfer gate 320 serves as the reflection layer, a quantum efficiency of the photoelectric conversion element PD may be increased. Moreover, because the first transfer gate 320 has the shape which overlaps vertically with the photoelectric conversion element PD, the fill factor of the photoelectric conversion element PD may be maximized, and at the same time, an integration degree of the unit pixel 300 may be improved.

The first transfer gate 320 may have a flat plate shape, and the outer sidewall of the first transfer gate 320 may be aligned with the outer sidewall of the photoelectric conversion element PD or be positioned outward of the outer sidewall of the photoelectric conversion element PD. In other words, a surface area of the first transfer gate 320 including the opening 326 may be equal or larger than a surface area of the photoelectric conversion element PD. In the described embodiment of FIGS. 1 and 2, the surface area of the first transfer gate 320 including the opening 326 is substantially equal with the surface area of the photoelectric conversion element PD.

Therefore, by controlling a bias to be applied to the first transfer gate 320, a dark current due to a defect on the first surface S1 of the substrate 310 which overlaps with the first transfer gate 320 may be prevented. For example, when the transfer transistor TX is in an off state, by applying a negative voltage such as an NCP (negative charge pump) voltage to the first transfer gate 320, generation of a dark current due to a defect on the first surface S1 of the substrate 310 may be prevented.

The first transfer gate 320 may include a first gate electrode 324 and a first gate dielectric layer 322 which surrounds the first gate electrode 324. The first gate dielectric layer 322 may have a shape for sealing the first gate electrode 324. For example, the first gate dielectric layer 322 may electrically isolate the photoelectric conversion element PD and the first gate electrode 324 from each other and also may electrically isolate the first gate electrode 324 and the channel layer 330 from each other. To this end, the first gate dielectric layer 322 may include a bottom dielectric layer 322A, a top dielectric layer 322B and a sidewall dielectric layer 322C. Each of the bottom, top and side dielectric layers 322A, 322B and 322C may include any one or at least two selected from the group consisting of an oxide, a nitride and an oxynitride. The bottom, top, and sidewall dielectric layers 322A, 322B and 322C may have different or the same thicknesses. For instance, for improving gate controllability of the first transfer gate 320 and reducing a parasitic capacitance between the first transfer gate 320 and an adjacent structure, the thicknesses of the bottom dielectric layer 322A and the top dielectric layer 322B may be thicker than the thickness of the sidewall dielectric layer 322C.

The opening 326 formed in the first transfer gate 320 may provide a space in which the channel layer 330 and the second transfer gate 340 are to be formed. The opening 326 may penetrate through the first transfer gate 320 to expose the first impurity region 312 of the photoelectric conversion element PD. The opening 326 may be positioned centrally relative to the photoelectric conversion element PD or the first transfer gate 320, and have a column shape having a circular cross-section. The position, the number and the shape of the opening 326 are not limited to the above-described embodiment, and may be modified variously. For example, the opening 326 may have a column shape which has a line cross-section, a polygon cross-section, a triangle cross-section or an ellipse cross-section. The opening 326 may be positioned at a periphery of the photoelectric conversion element PD or the first transfer gate 320.

The second transfer gate 340 may be formed on the channel layer 330, and have a shape which fills at least the opening 326. A transfer gate including the first transfer gate 320 and the second transfer gate 340 may have an area equal to or larger than the photoelectric conversion element PD. In the embodiment of FIGS. 1 and 2, the transfer gate including the first transfer gate 320 and the second transfer gate 340 is shown to have an area larger than the photoelectric conversion element PD. The first transfer gate 320 and the second transfer gate 340 may be subjected to the same or different transfer signals. Namely, the first and second transfer gates 320 and 340 may operate simultaneously in response to the same transfer signal, or operate independently of each other in response to different transfer signals. Similarly to the first transfer gate 320, by controlling a bias applied to the second transfer gate 340, the second transfer gate 340 may prevent a generation of dark current due to a defect on the first surface S1 of the substrate 310 which overlaps with the second transfer gate 340. For example, when the transfer transistor TX is in an off state, by applying a negative voltage such as an NCP (negative charge pump) voltage to the second transfer gate 340, a generation of dark current due to a defect on the first surface S1 of the substrate 310 corresponding to a bottom surface of the opening 326 may be prevented.

The second transfer gate 340 may include a second gate dielectric layer 342 which is formed conformally on the channel layer 330 and a second gate electrode 344 which is formed on the second gate dielectric layer 342. The second gate dielectric layer 342 may be formed on a surface of the structure including the channel layer 330, and have a constant thickness along the surface of the structure. The second gate dielectric layer 342 may include any one or at least two selected from the group consisting of an oxide, a nitride and an oxynitride. The second gate electrode 344 may fill the opening 326 and a portion of the second gate electrode 344 may protrude upward out of the opening 326. The second gate electrode 344 may include a semiconductor material or a metallic material.

The channel layer 330 may be controlled by the first transfer gate 320 and the second transfer gate 340. The channel layer 330 may include a silicon-containing material. For example, the channel layer 330 may be made of a silicon layer. The channel layer 330 may have different crystalline states in respective regions to improve a dark current characteristic.

For example, the channel layer 330 may include first to third regions 330A, 330B and 330C. The first region 330A of the channel layer 330 may be formed on the bottom surface of the opening 326 and may be in contact with the photoelectric conversion element PD or the substrate 310. The first region 330A of the channel layer 330 may have a single crystalline state. Preferably, the first region 330A of the channel layer 330 may include a single crystalline semiconductor material such as a single crystalline silicon layer. The first region 330A of the channel layer 330 may have the same crystal plane as the first surface S1 of the substrate 310. Namely, when the crystal plane of the first surface S1 of the substrate 310 has a Miller index of (100), the crystal plane of the first region 330A may have a Miller index of (100) as well. This is because the first region 330A of the channel layer 330 is formed by using the first surface S1 of the substrate 310 as a seed. As a result, by removing a defect capable of occurring on an interface where the photoelectric conversion element PD and the channel layer 330 are in contact with each other, that is, on the bottom surface of the opening 326, it is possible to prevent the generation of a dark current. The second region 330B may be formed to be separated from the photoelectric conversion element PD or the substrate 310. For example, the second region 330B may not contact with the photoelectric conversion element PD or the substrate 310. For example, the second region 330B may be formed on at least the sidewall of the opening 326. The second region 330B of the channel layer 330 may have a polycrystalline state. Accordingly, the second region 330B of the channel layer 330 may include a polycrystalline silicon layer, that is, a polysilicon layer. In addition, the second region 330B of the channel layer 330 may be formed on the first transfer gate 320 to serve as a floating diffusion FD. Therefore, the channel layer 330 may be formed on the first transfer gate 320 to be electrically coupled to a driver gate DG and the source of the reset transistor RX of the driving unit 301.

The third region 330C may be positioned between the first region 330A and the second region 330B. In other words, the third region 330C may be a region of the channel layer 330 which corresponds to a boundary region between the first region 330A and the second region 330B. For example, the third region 330C may be formed at the bottom corner of the opening 326. The third region 330C of the channel layer 330 may have a single crystalline state. For example, preferably the third region 330C of the channel layer 330 may include a single crystalline layer such as a single silicon crystalline layer. While having a single crystalline state, the third region 330C may have a crystal plane different from the first region 330A. For example, the crystal plane of the first region 330A may have a Miller index of (100), like the crystal plane of the first surface S1 of the substrate 310, and the Miller index of the crystal plane of the third region 330C may be (111) and/or (311). This is because the third region 330C is positioned at a corner of the opening 326.

The channel layer 330 may include any one among an undoped silicon layer, i.e. a silicon layer not doped with an impurity, a P-type silicon layer which is doped with a P-type impurity and an N-type silicon layer which is doped with an N-type impurity. In the case where the channel layer 330 includes the P-type silicon layer or the N-type silicon layer, an impurity doping concentration in the first to the third regions 330A, 330B, and 330C may be substantially uniform. Namely, the channel layer 330 may have a constant impurity doping concentration regardless of respective regions. In the case where the channel layer 330 includes the undoped silicon layer or the P-type silicon layer, the transfer transistor TX may operate in an enhancement mode in which a channel retains a deactivated state in the off state of the transfer transistor TX. Conversely, in the case where the channel layer 330 includes the N-type silicon layer, the transfer transistor TX may operate in a depletion mode in which a channel retains an activated state in the off state of the transfer transistor TX.

For reference, in the case where the channel layer 330 includes the undoped silicon layer or the P-type silicon layer, when a negative voltage is applied to the first transfer gate 320 and the second transfer gate 340 during the off state of the transfer transistor TX, for example, during an integration time, generation of dark current may be prevented as holes are accumulated in the channel layer 330 and at an interface where the photoelectric conversion element PD and the channel layer 330 are in contact with each other. Even if some small amount of dark current is generated, the generated dark current may be removed by a recombination of the holes accumulated at the interface. Furthermore, since the first region 330A of the channel layer 330 which is in contact with the photoelectric conversion element PD has a single crystalline state, the generation of dark current may be prevented effectively. Conversely, in the case where the channel layer 330 includes the N-type silicon layer, because the transfer transistor TX operates in the depletion mode, the dark current generated in the channel layer 330 and at the interface where the photoelectric conversion element PD and the channel layer 330 directly contact with each other may be discharged to an exterior through a contact (not shown) coupled to the channel layer 330, during the off state of the transfer transistor TX, for example, during an integration time.

Further, the image sensor in accordance with the first embodiment may include a charge trap layer 350 which is formed on the second surface S2 of the substrate 310, a color separation element 360 which is formed on the charge trap layer 350, and a light focusing element 370 which is formed on the color separation element 360.

The charge trap layer 350 may prevent a generation of dark current due to a defect on the second surface S2 of the substrate 310, that is, the incident surface. The charge trap layer 350 may include a silicon-containing material which has a single crystalline state, and may be doped with a high concentration of a predetermined impurity. The charge trap layer 350 may have the same crystal plane as the crystal plane of the second surface S2 of the substrate 310. For instance, the charge trap layer 350 may have a crystal plane having a Miller index of (100), and include a single crystalline silicon layer which is doped with a P-type impurity.

The color separation element 360 may include a color filter. The color filter may include a red filter, a green filter, a blue filter, a cyan filter, a yellow filter, a magenta filter, a white filter, a black filter, an IR cutoff filter, and so on. The light focusing element 370 may include a digital lens or a hemispherical lens.

As described above, since the image sensor in accordance with the first embodiment has a shape in which the photoelectric conversion element PD and the transfer transistor TX are stacked, higher integration is possible and characteristic degradation due to an increase of an integration degree may be prevented effectively. In particular, because the image sensor includes the channel layer 330 with regions of different crystalline states, a dark current characteristic may be improved effectively.

Hereafter, a method for fabricating the image sensor in accordance with the first embodiment will be described with reference to the drawings. FIGS. 3A to 3F are cross-sectional views corresponding to the line A-A' of FIG. 1, illustrating the method for fabricating the image sensor in accordance with the first embodiment.

Figure 3A:
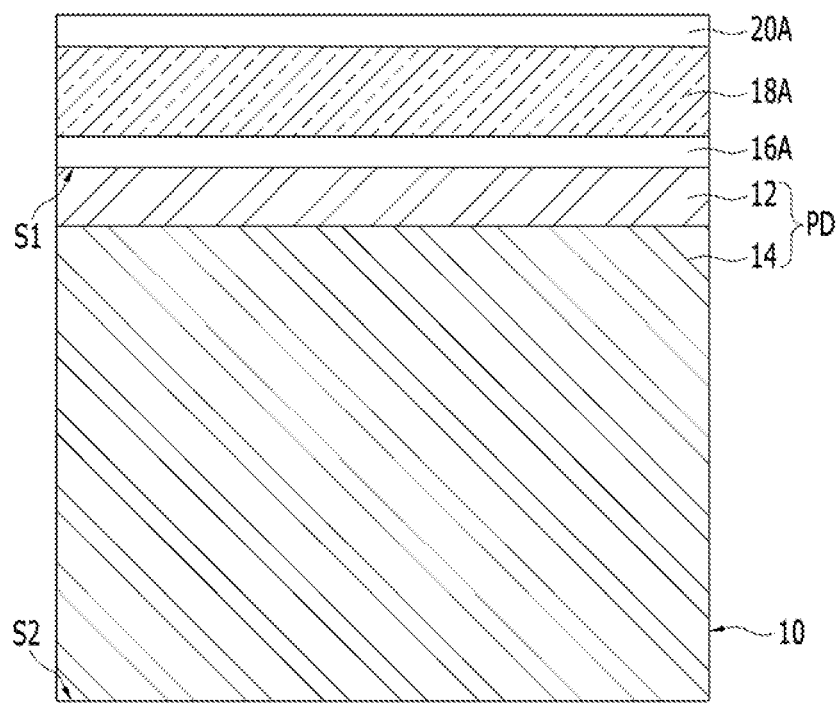
FIGS. 3A to 3F illustrate a method for fabricating the image sensor of an embodiment.

As shown in FIG. 3A, a substrate 10 having a first surface S1 and a second surface S2 may be prepared. The substrate 10 may include a single crystalline silicon-containing material. The crystal planes of the first surface S1 and the second surface S2 of the substrate 10 which has a single crystalline state may have Miller indices of (100).

An isolation structure (not shown) which isolates a photoelectric conversion element PD and an adjacent photoelectric conversion element PD from each other may be formed on the substrate 10. The isolation structure may be constructed by any one or a combination of at least two among an STI region, a DTI region and an impurity region.

The photoelectric conversion element PD may be formed as a photodiode. For example, the photoelectric conversion element PD may have a shape in which a first impurity region 12 and a second impurity region 14 are stacked vertically. The first impurity region 12 may be formed by implanting a P-type impurity into the substrate 10 and forming the first surface S1 of the substrate 10 and a second impurity region 14 may be formed by implanting an N-type impurity into the substrate 10. For example, boron (B) may be used as the P-type impurity, and phosphorus (P) or arsenic (As) may be used as the N-type impurity. The first impurity region 12 may be formed to have an impurity doping concentration lower than a saturated solids solubility for the impurity in the substrate 10. This may prevent an impurity in the first impurity region 12 from diffusing to a channel layer in a subsequent process for forming the channel layer.

A multi-layer may be formed by stacking sequentially a first dielectric layer 16A, a gate conductive layer 18A and a second dielectric layer 20A. The multi-layer may be formed on the first surface S1 of the substrate 10. The first dielectric layer 16A and the second dielectric layer 20A may include any one or at least two selected from the group consisting of an oxide, a nitride and an oxynitride. The gate conductive layer 18A may include a semiconductor material or a metallic material.

Figure 3B:
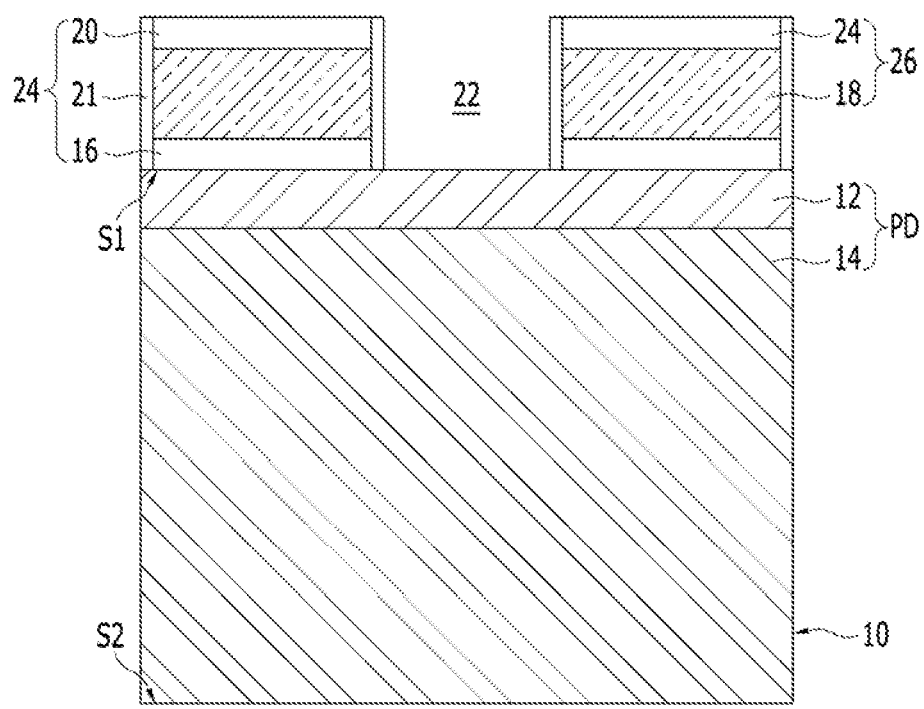

As shown in FIG. 3B, a pattern including an opening 22 which exposes the photoelectric conversion element PD may be formed. This may be formed by forming first a mask pattern (not shown) on the multi-layer of FIG. 3A which includes the sequentially stacked first dielectric layer 16A, the gate conductive layer 18A and the second dielectric layer 20A. Then by etching the multi-layer using the mask pattern as an etch barrier, a pattern including an opening 22 which exposes the photoelectric conversion element PD may be formed. An etching process for forming the opening 22 may be performed as a dry etch.

The pattern including the opening 22 may have a structure in which a bottom dielectric layer 16, a first gate electrode 18 and a top dielectric layer 20 are stacked sequentially. The opening 22 may be positioned at a center portion of the photoelectric conversion element PD. The opening 22 may have a column shape which has a line cross-section, a polygon cross-section, a triangle cross section or an ellipse cross-section.

A sidewall dielectric layer 21 may be formed on a sidewall of the pattern including a sidewall of the opening 22. The sidewall dielectric layer 21 may be formed through a series of processes of forming a dielectric layer on a surface of the structure including the pattern and then performing a blanket etching, for example, an etch-back. The sidewall dielectric layer 21 may include any one or at least two selected from the group consisting of an oxide, a nitride and an oxynitride. Using this process, a first transfer gate 26 may be formed. The first transfer gate 26 may include the first gate electrode 18 and a first gate dielectric layer 24 which seals the first gate electrode 18. The first gate dielectric layer 24 may include the bottom dielectric layer 16, the top dielectric layer 20 and the sidewall dielectric layer 21.

It is noted, however, that a defect may occur on the first surface S1 of the substrate 10 which is exposed in a process for forming the opening 22, that is, on the bottom surface of the opening 22. The defect may serve as a dark current source.

Figure 3C:
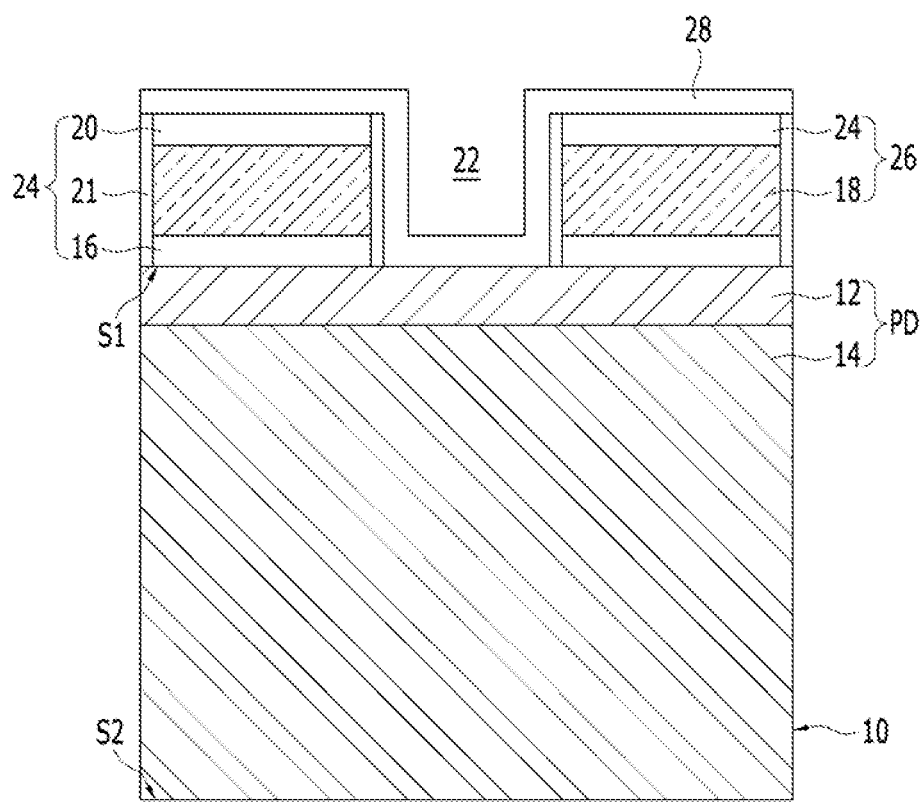

As shown in FIG. 3C, a pre-channel layer 28 may be formed on the surface of the structure including the opening 22. The pre-channel layer 28 may be formed to have a constant thickness along the surface of the structure. The pre-channel layer 28 may include a silicon-containing material, and may be formed to have an amorphous state. For instance, the pre-channel layer 28 may be formed as an amorphous silicon layer. The amorphous silicon layer may be formed through a low temperature deposition process. For example, in an embodiment, the low temperature deposition process may be performed at about 510° C.

While forming the pre-channel layer 28, a predetermined impurity may be implanted into the pre-channel layer 28. As the impurity, a P-type impurity including boron (B) or an N-type impurity including phosphorus (P) or arsenic (As) may be used.

Figure 3D:
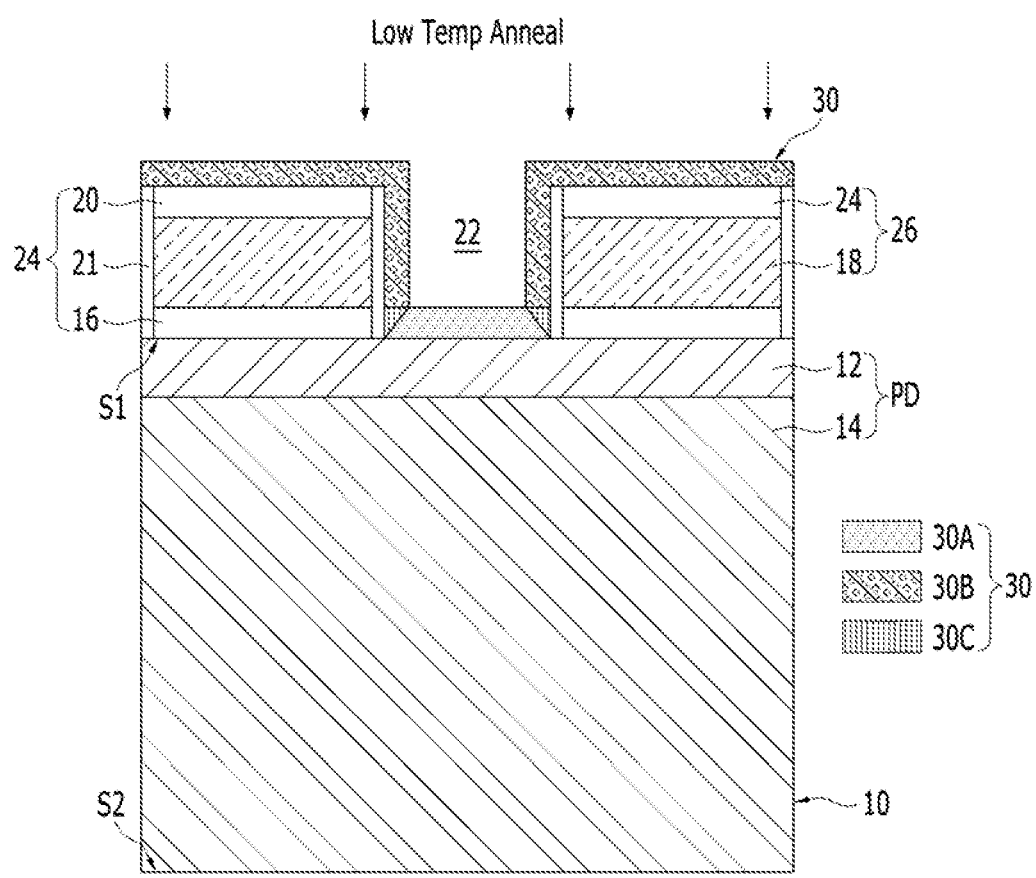

As shown in FIG. 3D, by recrystallizing the pre-channel layer 28 through a low temperature annealing process for the pre-channel layer 28, a channel layer 30 may be formed. The low temperature annealing process may be performed at a temperature equal to or lower than about 600° C. For example, the low temperature annealing process may be performed at a temperature ranging from about 550° C. to about 600° C. The annealing process may be performed at a low temperature may prevent a doping profile of the photoelectric conversion element PD from being changed and prevent an impurity in the first impurity region 12 from diffusing to the channel layer 30. Moreover, through the low temperature annealing process, a defect which may have occurred on the bottom surface of the opening 22 may be removed.

As the low temperature annealing process is performed, the channel layer 30 may have different crystalline states for respective regions. For example, the channel layer 30 may be divided into a first region 30A which is formed on the bottom surface of the opening 22 and contacts with the photoelectric conversion element PD, a second region 30B which is formed on the sidewall of the opening 22 and is separated from the photoelectric conversion element PD, and a third region 30C which is formed at the bottom corner of the opening 22 between the first region 30A and the second region 30B.

Through the low temperature annealing process, the first region 30A of the channel layer 30 may have a single crystalline state as a recrystallization is performed by using the first surface S1 of the substrate 10 as a seed. That is to say, the first region 30A of the channel layer 30 may be a single crystalline silicon layer. Because the recrystallization is performed by using the first surface S1 of the substrate 10 as a seed, the crystal plane of the first region 30A may be the same as the crystal plane of the first surface S1 of the substrate 10. For example, the crystal plane of the first region 30A may have a Miller index of (100). As the first region 30A of the channel layer 30 is recrystallized, defects on the first surface S1 of the substrate 10 which contacts with the first region 30A of the channel layer 30 may be removed. As a consequence, a dark current characteristic may be improved.

The low temperature annealing process may bond and grow crystal grains in the second region 30B of the channel layer 30, causing the second region 30B to have a polycrystalline state. In other words, the second region 30B of the channel layer 30 may be a polycrystalline silicon layer (that is, a polysilicon layer). Because the recrystallization into a polycrystalline state is performed by bonding and growing the crystal grains, a polycrystalline state of high quality may be implemented when compared to a silicon layer having a polycrystalline state during a deposition process.

Through the low temperature annealing process, the third region 30C of the channel layer 30 may have a single crystalline state as recrystallization is performed by using the side surface of the first region 30A of the channel layer 30 as a seed. Namely, the third region 30C of the channel layer 30 may be a single crystalline silicon layer. Because the recrystallization is performed by using the side surface of the first region 30A of the channel layer 30 as a seed, the third region 30C may have a crystal plane different from the first region 30A. For example, the crystal plane of the third region 30C may have Miller indices of (111) or/and (311).

Meanwhile, in the case where a predetermined impurity is implanted in the process of forming the pre-channel layer 28, the implanted impurity may be activated through the low temperature annealing process.

Figure 3E:
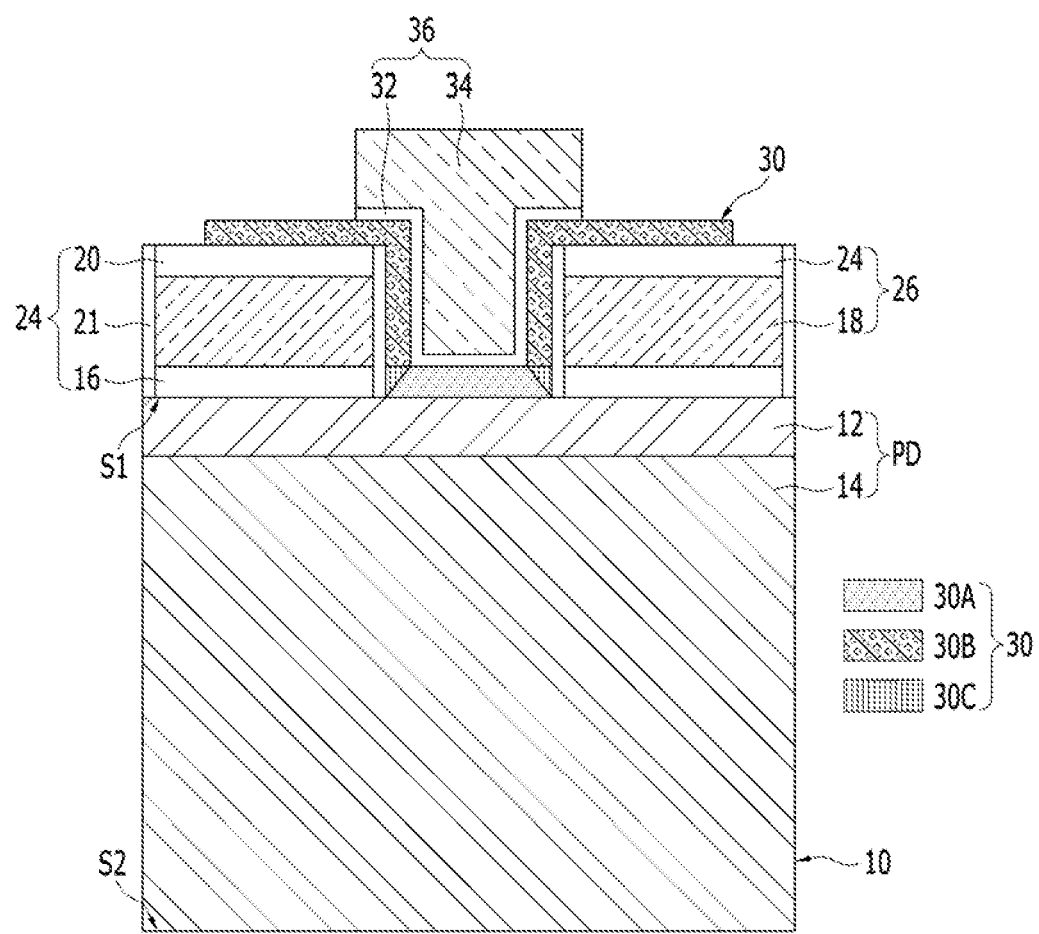

As shown in FIG. 3E, a second transfer gate 36 which fills at least the opening 22 may be formed on the channel layer 30. The second transfer gate 36 may include a second gate dielectric layer 32 which is conformally formed on the channel layer 30 and a second gate electrode 34 which is formed on the second gate dielectric layer 32. The second transfer gate 36 may be formed through a series of processes of forming a dielectric layer on the surface of the structure which includes the channel layer 30, forming a conductive layer on the entire surface of the structure to fill at least the opening 22 and then etching selectively the conductive layer and the dielectric layer.

Meanwhile, the channel layer 30 may be patterned in the process for forming the second transfer gate 36. The second gate dielectric layer 32 may be formed to remain on the channel layer 30.

Figure 3F:
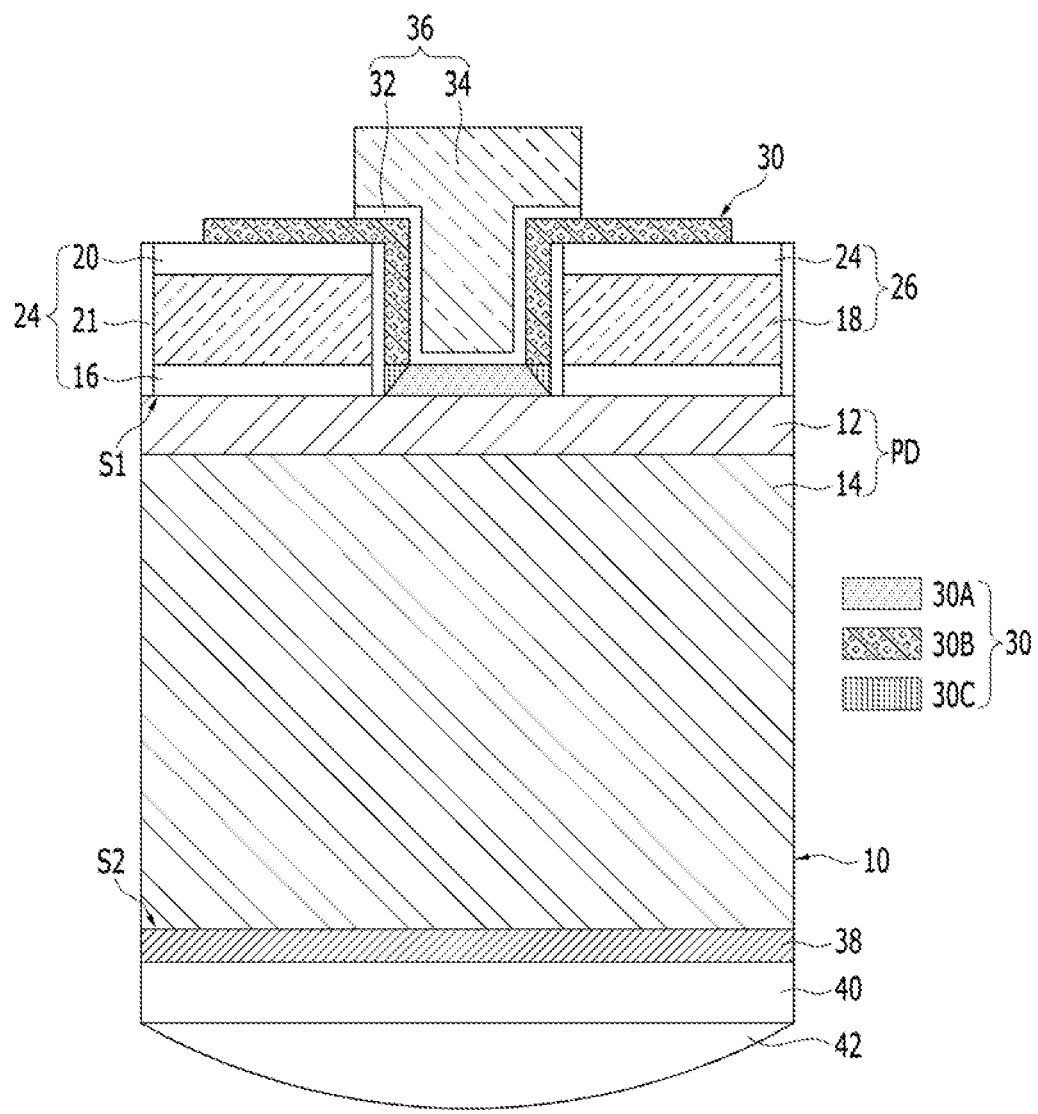

As shown in FIG. 3F, a charge trap layer 38 may be formed on the second surface S2 of the substrate 10. The charge trap layer 38 may include a silicon-containing material which has a single crystalline state, and may be doped with a high concentration of a predetermined impurity. The charge trap layer 38 may have the same crystal plane as the crystal plane of the second surface S2 of the substrate 10. For instance, the charge trap layer 38 may have a crystal plane having a Miller index of (100), and include a single crystalline silicon layer which is doped with a P-type impurity.

While not shown in the drawing, the charge trap layer 38 may be formed by applying the above-described process for forming the channel layer 30. For example, a P-type impurity region may be formed by implanting a P-type impurity into the second surface S2 of the substrate 10. The P-type impurity region may be formed to have an impurity doping concentration that is larger than the saturated solids solubility for the impurity in the substrate 10. Then, an amorphous silicon layer may be deposited on the second surface S2 of the substrate 10, as a pre-charge trap layer. Thereupon, a low temperature annealing process may be performed. In the low temperature annealing process, as a recrystallization is performed by using the second surface S2 of the substrate 10 as a seed and at the same time the P-type impurity in the P-type impurity region is diffused, a single crystalline silicon layer doped with the P-type impurity may be formed and at the same time a defect on the second surface S2 of the substrate 10 may be removed.

Next, a color separation element 40 and a light focusing element 42 may be formed sequentially on the charge trap layer 38.

Thereafter, the image sensor may be completely fabricated through a processing method known in the art.

Figure 4:
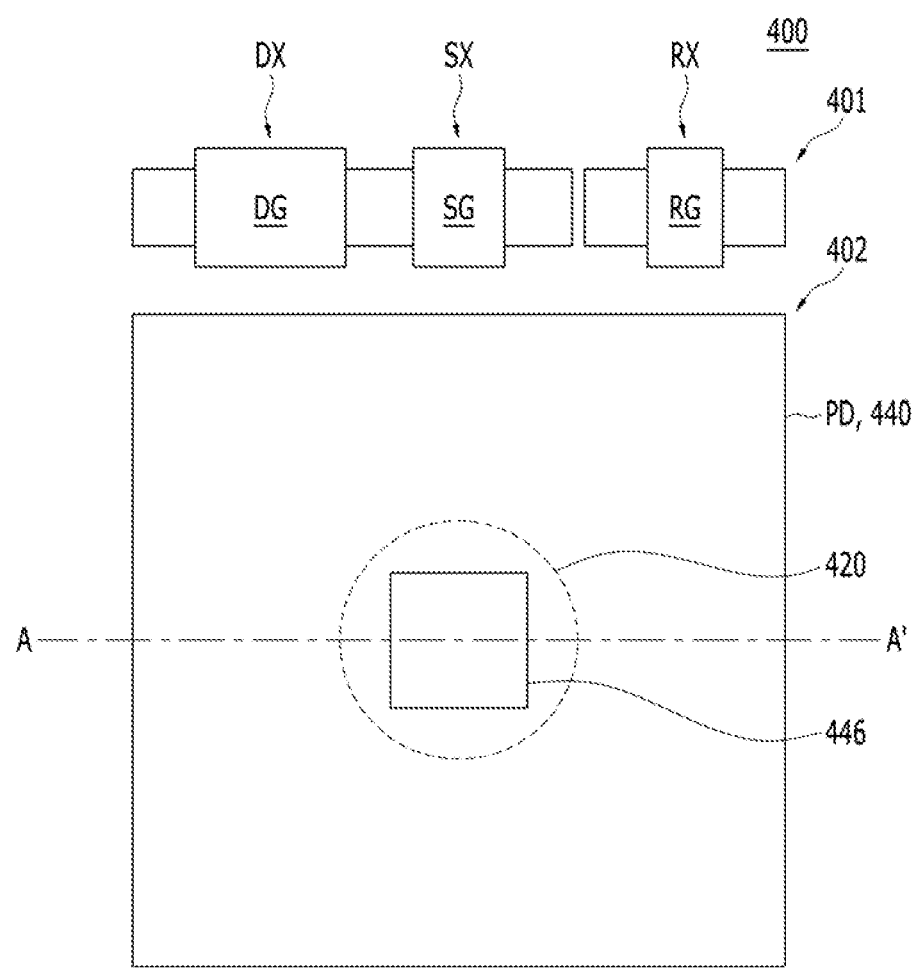
FIGS. 4 and 5 illustrate an image sensor in accordance with an embodiment.
Figure 5:
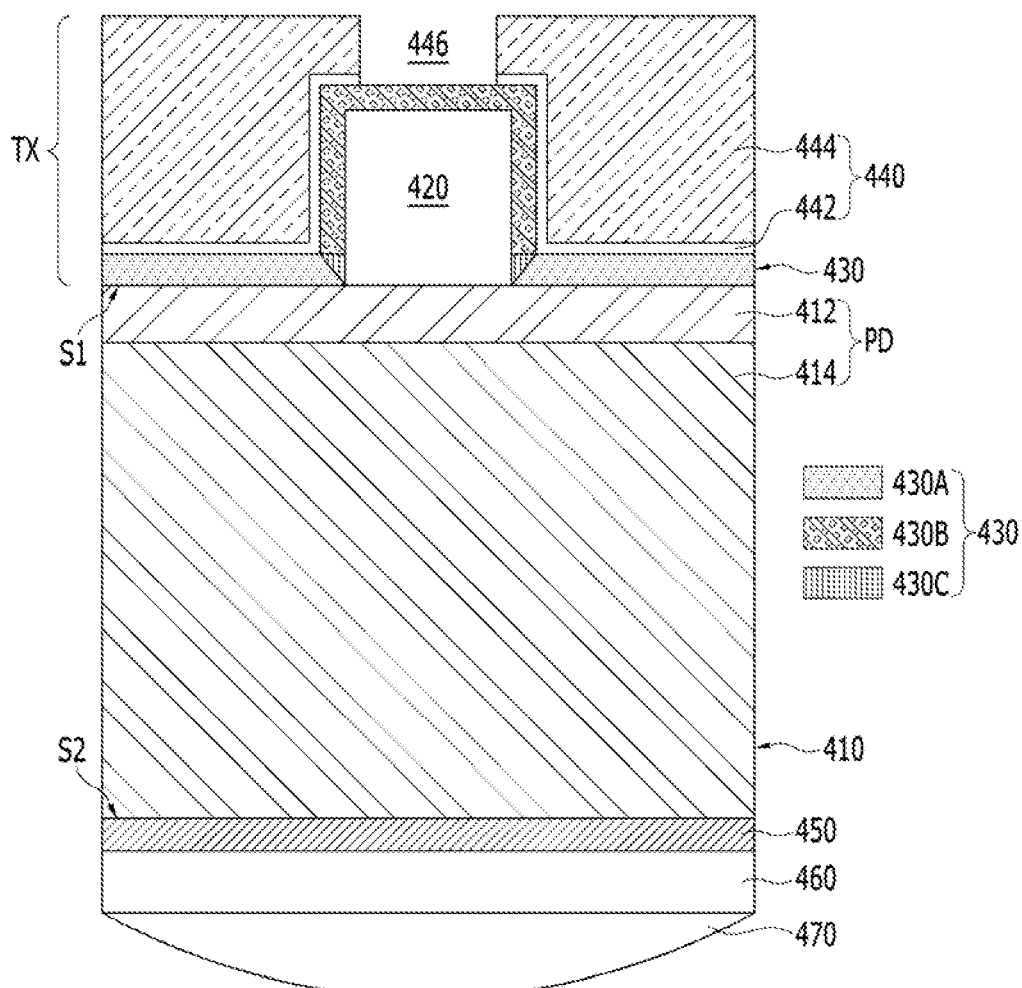

FIGS. 4 and 5 are views illustrating an image sensor in accordance with a second embodiment. FIG. 4 is a plan view, and FIG. 5 is a cross-sectional view taken along line A-A' of FIG. 4.

As shown in FIGS. 4 and 5, the image sensor in accordance with the second embodiment may include a pixel array including a plurality of unit pixels 400 arranged in a matrix structure. Each of the plurality of unit pixels 400 may include a light receiving unit 402 suitable for generating photocharges in response to incident light, and a driving unit 401 suitable for generating an output image signal corresponding to the photocharges generated in the light receiving unit 402. The driving unit 401 may include a reset transistor RX, a driver transistor DX and a selection transistor SX. The light receiving unit 402 and the driving unit 401 may be electrically isolated by an isolation structure (not shown). The isolation structure may include at least one of an STI region, a DTI region and an impurity region. The isolation structure may be constructed by any one or a combination of at least two among an STI region, a DTI region and an impurity region.

The light receiving unit 402 may include a photoelectric conversion element PD which generates photocharges in response to the incident light, and a transfer transistor TX which transfers the photocharges generated in the photoelectric conversion element PD, to a floating diffusion in response to a transfer signal.

The photoelectric conversion element PD may include an organic or inorganic photodiode. For example, the photoelectric conversion element PD may have a shape in which a first impurity region 412 and a second impurity region 414 having complementary conductivity types formed in a substrate 410 are stacked in a vertical direction. The first impurity region 412 may be a P-type impurity region, and form a first surface S1 of the substrate 410. An impurity doping concentration of the first impurity region 412 may be lower than a saturated solids solubility for the impurity in the substrate 410. This may prevent an impurity in the first impurity region 412, for example, a P-type impurity, from diffusing to a channel layer 430 in a process for forming the channel layer 430. The second impurity region 414 may be an N-type impurity region, and have a thickness larger than the first impurity region 412. In the vertical direction, the second impurity region 414 may have a uniform doping profile or a profile that an impurity doping concentration increases gradually in a charge moving direction. The charge moving direction may mean a direction in which electrical charges move from the photoelectric conversion element PD to the transfer transistor TX. In other words, the charge moving direction may be a direction that faces from a second surface S2 to the first surface S1 of the substrate 410 (S2→S1). The second surface S2 of the substrate 410 may be an incident surface through which incident light is introduced into the photoelectric conversion element PD.

The substrate 410 may include any suitable semiconductor substrate. For example, the semiconductor substrate may be a single crystalline state, and include a silicon-containing material. That is to say, the substrate 410 may include a single crystalline silicon-containing material. The first surface S1 and the second surface S2 of the substrate 410 in the single crystalline state may have crystal planes expressed by Miller indices. For instance, the crystal planes of the first surface S1 and the second surface S2 of the substrate 410 may have a Miller index of (100). The substrate 410 may be a substrate which is thinned through a thinning process or a substrate which includes an epitaxial layer formed through an epitaxial growth. For instance, the substrate 410 may be a bulk silicon substrate which is thinned through a thinning process.

The transfer transistor TX may include at least one pillar 420 which is formed on the photoelectric conversion element PD, a channel layer 430 which is formed on the surface of the pillar 420 and contacts with the photoelectric conversion element PD at an end thereof, and a transfer gate 440 which is formed on the channel layer 430. The transfer gate 440 may include an opening 446 which exposes the channel layer 430. The channel layer 430 which is exposed through the opening 446 may be electrically coupled to a driver gate DG and a source of the reset transistor RX of the driving unit 401.

The pillar 420 formed on the first surface S1 of the substrate 410 is to provide a channel length required by the transfer transistor TX. The pillar 420 may have a planar shape of a polygon including a triangle, a circle or an ellipse. The pillar 420 may be positioned at the center portion of the photoelectric conversion element PD. The pillar 420 may have a vertical sidewall or an inclined sidewall. The pillar 420 having an inclined sidewall may have a shape of a frustum of pyramid. Also, the pillar 420 may have a sidewall which has a structure of prominences and depressions. The channel length may be controlled easily depending on the height and the sidewall shape of the pillar 420. The pillar 420 may include a dielectric material. For example, the pillar 420 may include any one or at least two selected from the group consisting of an oxide, a nitride and an oxynitride.

The channel layer 430 may cover the photoelectric conversion element PD and the pillar 420 and may be controlled by the transfer gate 440. The channel layer 430 may include a silicon-containing material. For example, the channel layer 430 may be a silicon layer. The channel layer 430 may have different crystalline states for respective regions to improve a dark current characteristic.

For example, the channel layer 430 may include a first region 430A to a third region 430C. The first region 430A may contact with the photoelectric conversion element PD or the substrate 410. The first region 430A of the channel layer 430 may have a single crystalline state. Accordingly, the first region 430A of the channel layer 430 may include a single crystalline silicon layer. The first region 430A of the channel layer 430 may have the same crystal plane as the first surface S1 of the substrate 410. Namely, when the crystal plane of the first surface S1 of the substrate 410 has a Miller index of (100), the crystal plane of the first region 430A may have a Miller index of (100) as well. This is because the first region 430A of the channel layer 430 is formed by using the first surface S1 of the substrate 410 as a seed. Through this, by removing a defect on an interface where the photoelectric conversion element PD and the channel layer 430 contacts with each other, it is possible to prevent the dark current from being generated.

The second region 430B may be separated from the photoelectric conversion element PD or the substrate 410. That is to say, the second region 430B may not contact the photoelectric conversion element PD or the substrate 410. For example, the second region 430B may be formed on at least the sidewall of the pillar 420. The second region 430B of the channel layer 430 may have a polycrystalline state. Accordingly, the second region 430B of the channel layer 430 may include a polycrystalline silicon layer, that is, a polysilicon layer. The channel layer 430 which is exposed through the opening 446 of the transfer gate 440 in the second region 430B may serve as a floating diffusion, and be electrically coupled to the driver gate DG and the source of the reset transistor RX of the driving unit 401.

The third region 430C may be positioned between the first region 430A and the second region 430B. In other words, the third region 430C may be a region of the channel layer 430 which corresponds to a boundary region between the first region 430A and the second region 430B. For example, the third region 430C may be formed at the bottom corner of the pillar 420 where the pillar 420 and the substrate 410 contact with each other. The third region 430C of the channel layer 430 may have a single crystalline state. Accordingly, the third region 430C of the channel layer 430 may include a single crystalline silicon layer. While having a single crystalline state, the third region 430C may have a crystal plane different from the first region 430A. For example, the crystal plane of the first region 430A may be (100) the same as the crystal plane of the first surface S1 of the substrate 410, and the crystal plane of the third region 430C may have Miller indices (111) and/or (311). This is because the third region 430C is positioned at the corner where the pillar 420 and the substrate 410 contact with each other.

The channel layer 430 may include any one among an undoped silicon layer, i.e. a silicon layer not doped with an impurity, a P-type silicon layer which is doped with a P-type impurity and an N-type silicon layer which is doped with an N-type impurity. In the case where the channel layer 430 includes the P-type silicon layer or the N-type silicon layer, an impurity doping concentration in the first region 430A to the third region 430C may be substantially uniform. Namely, the channel layer 430 may have a constant impurity doping concentration regardless of respective regions. In the case where the channel layer 430 includes the undoped silicon layer or the P-type silicon layer, the transfer transistor TX may operate in an enhancement mode in which a channel retains a deactivated state in the off state of the transfer transistor TX. Conversely, in the case where the channel layer 430 includes the N-type silicon layer, the transfer transistor TX may operate in a depletion mode in which a channel retains an activated state in the off state of the transfer transistor TX.

For reference, in the case where the channel layer 430 includes the undoped silicon layer or the P-type silicon layer, when a negative voltage is applied to the transfer gate 440 during the off state of the transfer transistor TX, for example, an integration time, a generation of dark current may be prevented as holes are accumulated in the channel layer 430 and at an interface where the photoelectric conversion element PD and the channel layer 430 contact each other. Even when the dark current is generated, the generated dark current may be removed by a recombination of the holes accumulated at the interface. Furthermore, since the first region 430A of the channel layer 430 which contacts with the photoelectric conversion element PD has a single crystalline state, the generation of dark current may be prevented effectively. Conversely, in the case where the channel layer 430 includes the N-type silicon layer, because the transfer transistor TX operates in the depletion mode, the dark current generated in the channel layer 430 and at the interface where the photoelectric conversion element PD and the channel layer 430 contact with each other may be discharged to an exterior through a contact (not shown) coupled to the channel layer 430, during the off state of the transfer transistor TX, for example, an integration time.

The transfer gate 440 may be formed on the first surface S1 of the substrate 410 including the photoelectric conversion element PD and overlap vertically with the photoelectric conversion element PD. The transfer gate 440 may surround the sidewall of the pillar 420, to implement a vertical channel. The transfer gate 440 may have a flat plate shape which overlaps with the photoelectric conversion element PD. Because the transfer gate 440 is formed on the first surface S1 away from the incident surface through which incident light is introduced into the photoelectric conversion element PD, that is, the second surface S2 of the substrate 410, the transfer gate 440 may serve as a backside reflection layer for incident light passing through the photoelectric conversion element PD. As the transfer gate 440 serves as the reflection layer, a quantum efficiency of the photoelectric conversion element PD may be increased. Moreover, because the transfer gate 440 overlaps vertically with the photoelectric conversion element PD, the fill factor of the photoelectric conversion element PD may be maximized, and at the same time, an integration degree of the unit pixel 400 may be readily improved.

The transfer gate 440 may have a flat plate shape, and the outer sidewall of the transfer gate 440 may be aligned with the outer sidewall of the channel layer 430. Further, the outer sidewall of the transfer gate 440 may be aligned with the outer sidewall of the photoelectric conversion element PD or be positioned outward of the outer sidewall of the photoelectric conversion element PD. In other words, a surface area of the transfer gate 440 including the opening 446 may be larger than a surface area of the photoelectric conversion element PD. Therefore, by controlling a bias to be applied to the transfer gate 440, a generation of a dark current due to a defect of the first surface S1 of the substrate 410 which overlaps with the transfer gate 440 may be prevented. For example, when the transfer transistor TX is in an off state, by applying a negative voltage such as an NCP (negative charge pump) voltage to the transfer gate 440, a generation of a dark current due to a defect on the first surface S1 of the substrate 410 may be prevented.

The transfer gate 440 may include a gate dielectric layer 442 and a gate electrode 444. The gate dielectric layer 442 may be formed on the channel layer 430, and have a uniform thickness. The gate dielectric layer 442 may include any one or at least two selected from the group consisting of an oxide, a nitride and an oxynitride. The gate electrode 444 may include a semiconductor material including silicon or a metallic material.

The opening 446 formed in the transfer gate 440 may be formed to expose the second region 430B of the channel layer 430 to electrically couple the channel layer 430 and an adjacent structure. For instance, the opening 446 may be formed to expose the channel layer 430 which is formed on the top surface of the pillar 420. The opening 446 may have a planar shape of a polygon including a triangle, a circle or an ellipse.

Further, the image sensor in accordance with the second embodiment may include a charge trap layer 450 which is formed on the second surface S2 of the substrate 410, a color separation element 460 which is formed on the charge trap layer 450, and a light focusing element 470 which is formed on the color separation element 460.

The charge trap layer 450 may prevent a generation of dark current due to a defect on the second surface S2 of the substrate 410, that is, the incident surface. To this end, the charge trap layer 450 may include a silicon-containing material which has a single crystalline state, and may be doped with a high concentration of a predetermined impurity. The charge trap layer 450 may have the same crystal plane as the crystal plane of the second surface S2 of the substrate 410. For instance, the charge trap layer 450 may have a crystal plane having a Miller index of (100), and include a single crystalline silicon layer which is doped with a P-type impurity.

The color separation element 460 may include a color filter, and the color filter may include a red filter, a green filter, a blue filter, a cyan filter, a yellow filter, a magenta filter, a white filter, a black filter, an IR cutoff filter, and so on. The light focusing element 470 may include a digital lens or a hemispherical lens.

As described above, since the image sensor in accordance with the second embodiment has a shape in which the photoelectric conversion element PD and the transfer transistor TX are stacked, high integration is easy and characteristic degradation due to an increase of an integration degree may be prevented effectively. In particular, because the image sensor includes the channel layer 430 with regions having different crystalline states, a dark current characteristic may be improved effectively.

Hereafter, a method for fabricating the image sensor in accordance with the second embodiment will be described with reference to the drawings. FIGS. 6A to 6E are cross-sectional views corresponding to line A-A' of FIG. 4, to illustrate the method for fabricating the image sensor in accordance with the second embodiment.

Figure 6A:
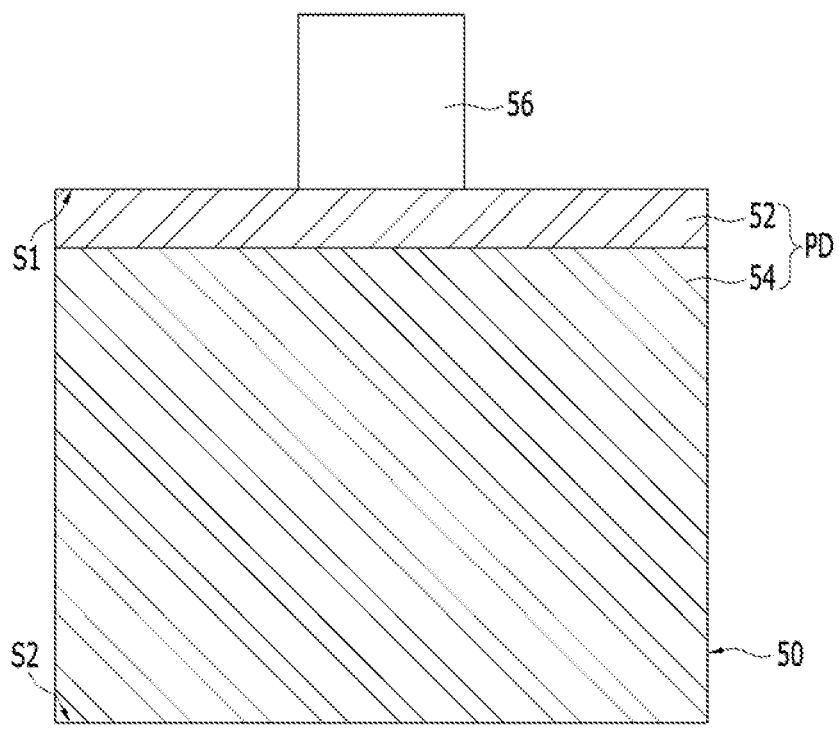
FIGS. 6A to 6E illustrate a method for fabricating the image sensor of an embodiment.

As shown in FIG. 6A, a substrate 50 having a first surface S1 and a second surface S2 may be prepared. The substrate 50 may include a single crystalline silicon-containing material. The crystal planes of the first surface S1 and the second surface S2 of the substrate 50 which has a single crystalline state may have Miller indices of (100).

An isolation structure (not shown) which isolates a photoelectric conversion element PD and an adjacent photoelectric conversion element PD from each other may be formed on the substrate 50. The substrate 50 may include a single crystalline silicon-containing material. The crystal planes of the first surface S1 and the second surface S2 of the substrate 50 which has a single crystalline state may have the Miller index of (100). The isolation structure may be constructed by any one or a combination of at least two among an STI region, a DTI region and an impurity region.

The photoelectric conversion element PD may be formed as a photodiode. For example, the photoelectric conversion element PD may have a shape in which a first impurity region 52 and a second impurity region 54 are stacked vertically. The first impurity region 52 may be formed by implanting a P-type impurity into the substrate 50 and forming the first surface S1 of the substrate 50 and a second impurity region 54 may be formed by implanting an N-type impurity into the substrate 50. Boron (B) may be used as the P-type impurity, and phosphorus (P) or arsenic (As) may be used as the N-type impurity. The first impurity region 52 may be formed to have an impurity doping concentration lower than a saturated solids solubility for the impurity in the substrate 50. This may prevent an impurity in the first impurity region 52 from diffusing to a channel layer in a subsequent process employed for forming the channel layer.

Then, a pillar 56 may be formed on the first surface S1 of the substrate 50. The pillar 56 may provide a channel length required by a transfer transistor. The pillar 56 may be formed as a single layer of any one or a multi-layer of at least two selected from the group consisting of an oxide, a nitride and an oxynitride. For example, the pillar 56 may be formed through a series of processes of forming sequentially a dielectric layer and a mask pattern (not shown) on the substrate 50 and then etching the dielectric layer by using the mask pattern as an etch barrier.

A defect may occur on the first surface S1 of the substrate 50 which is exposed in a process for forming the pillar 56. The defect may serve as a dark current source.

Figure 6B:
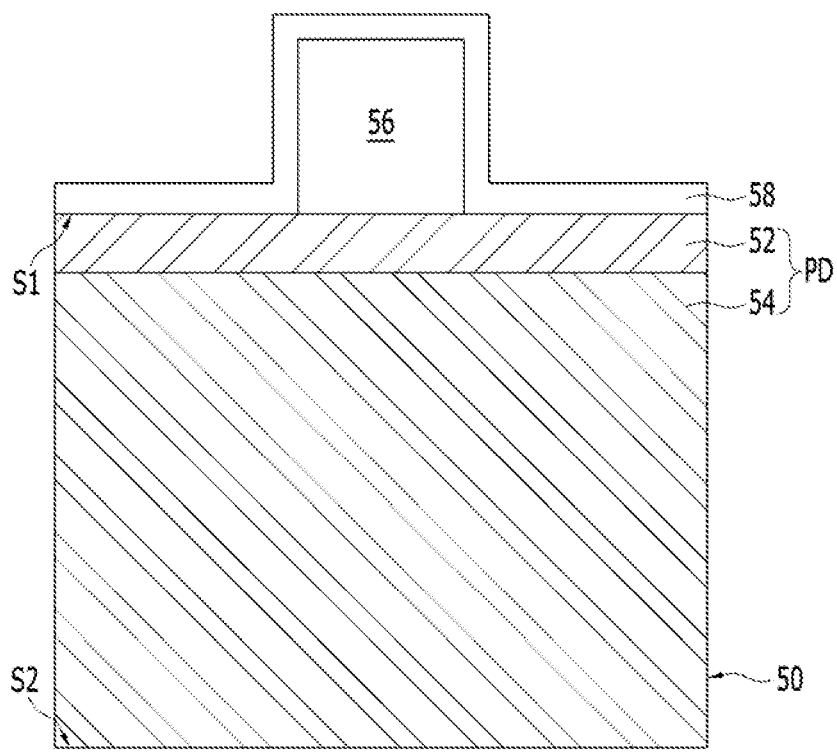

As shown in FIG. 6B, a pre-channel layer 58 may be formed on the surface of the structure including the pillar 56. The pre-channel layer 58 may be formed to have a constant thickness along the surface of the structure. The pre-channel layer 58 may include a silicon-containing material, and be formed to have an amorphous state. For instance, the pre-channel layer 58 may be formed as an amorphous silicon layer. The amorphous silicon layer may be formed through a low temperature deposition process. For example the low temperature deposition process may be performed at about 510° C.

Meanwhile, while forming the pre-channel layer 58, a predetermined impurity may be implanted into the pre-channel layer 58. As the impurity, a P-type impurity including boron (B) or an N-type impurity including phosphorus (P) or arsenic (As) may be used.

Figure 6C:
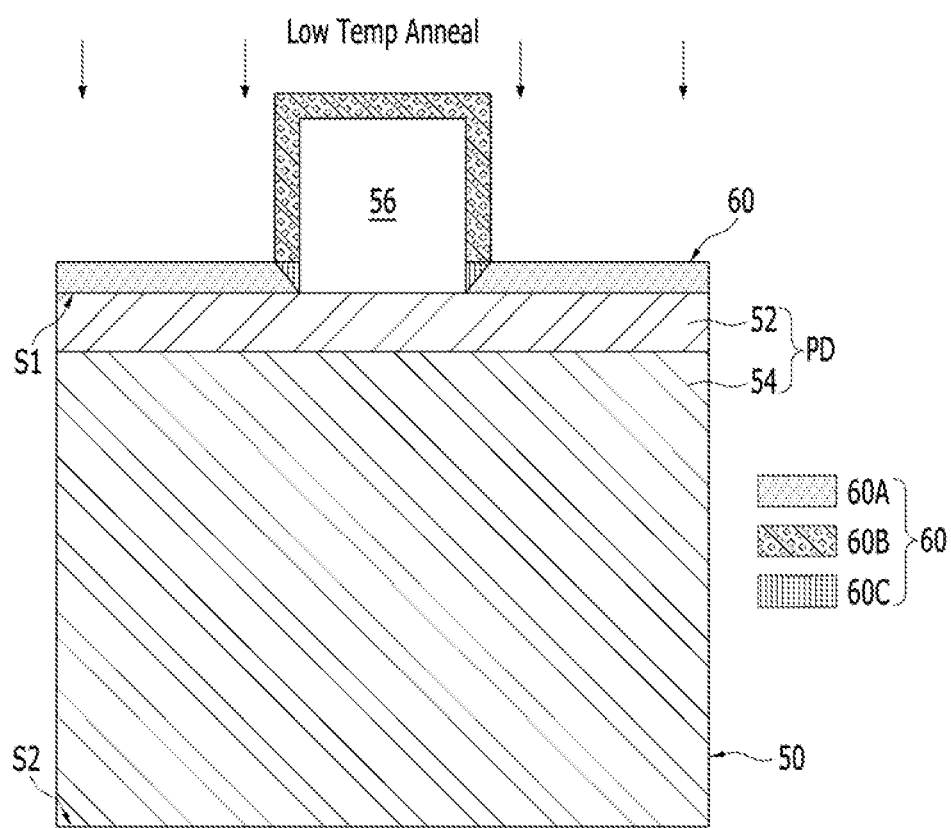

As shown in FIG. 6C, by recrystallizing the pre-channel layer 58 through a low temperature annealing process for the pre-channel layer 58, a channel layer 60 is formed. The low temperature annealing process may be performed at a temperature equal to or lower than 600° C. For example, the low temperature annealing process may be performed at a temperature ranging from about 550° C. to about 600° C. The annealing process may be performed at a low temperature to prevent a doping profile of the photoelectric conversion element PD from being changed and prevent an impurity in the first impurity region 52 from diffusing to the channel layer 60. Further, through the low temperature annealing process, a defect may have occurred on the first surface S1 of the substrate 50 may be removed during the process.

As the low temperature annealing process is performed, the channel layer 60 may have different crystalline states for respective regions. For example, the channel layer 60 may be divided into a first region 60A which is formed on the first surface S1 of the substrate 50 and contacts with the photoelectric conversion element PD, a second region 60B which is separated from the photoelectric conversion element PD, and a third region 60C which is formed at the corner of the pillar 56 contacting with the substrate 50 between the first region 60A and the second region 60B.

Through the low temperature annealing process, the first region 60A of the channel layer 60 may have a single crystalline state as a recrystallization is performed by using the first surface S1 of the substrate 50 as a seed. That is to say, the first region 60A of the channel layer 60 may be a single crystalline silicon layer. Because the recrystallization is performed by using the first surface S1 of the substrate 50 as a seed, the crystal plane of the first region 60A may be the same as the crystal plane of the first surface S1 of the substrate 50. For example, the crystal plane of the first region 60A may have a Miller index of (100). As the first region 60A of the channel layer 60 is recrystallized, defects on the first surface S1 of the substrate 50 which contacts with the first region 60A of the channel layer 60 may be removed. As a consequence, a dark current characteristic may be improved.

The low temperature annealing process may bond and grow crystal grains in the second region 60B of the channel layer 60, causing the second region 60B having a polycrystalline state. In other words, the second region 60B of the channel layer 60 may be a polycrystalline silicon layer (that is, a polysilicon layer). Because the recrystallization into a polycrystalline state is performed by bonding and growing crystal grains, a polycrystalline state of high quality may be implemented when compared to a silicon layer having a polycrystalline state during a deposition process.

Through the low temperature annealing process, the third region 60C of the channel layer 60 may have a single crystalline state as a recrystallization is performed by using the side surface of the first region 60A of the channel layer 60 as a seed. Namely, the third region 60C of the channel layer 60 may be a single crystalline silicon layer. Because the recrystallization is performed by using the side surface of the first region 60A of the channel layer 60 as a seed, the third region 60C may have a crystal plane different from the first region 60A. For example, the crystal plane of the third region 60C may have Miller indices of (111) or/and (311).

In the case where a predetermined impurity is implanted in the process of forming the pre-channel layer 58, the implanted impurity may be activated through the low temperature annealing process.

Figure 6D:
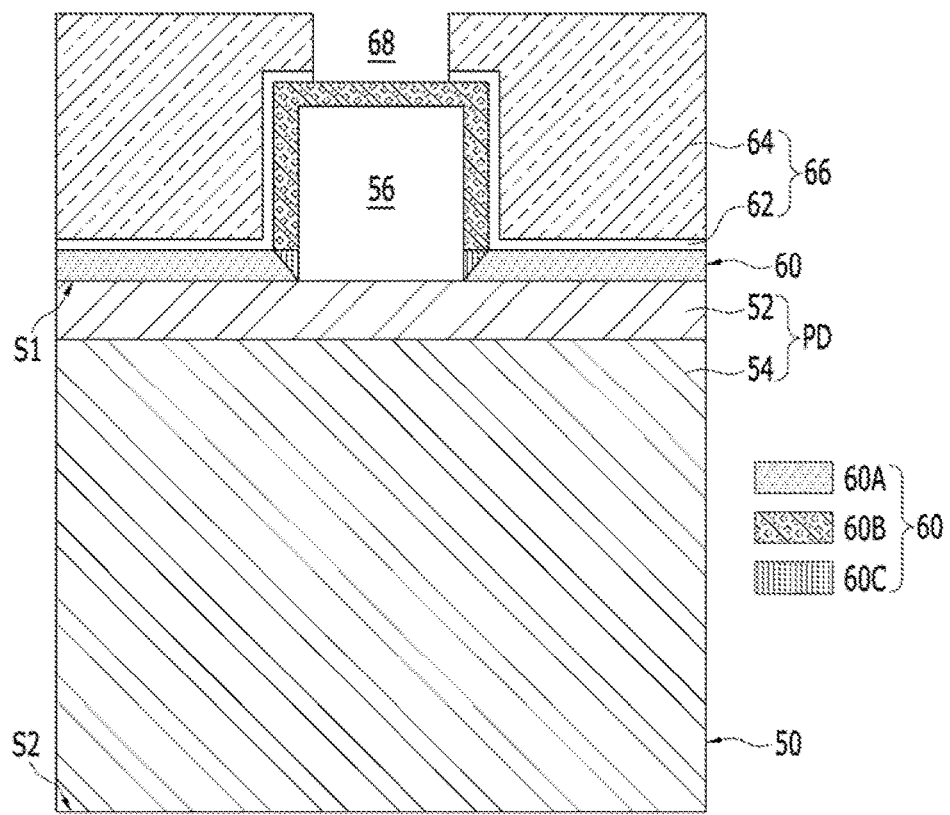

As shown in FIG. 6D, a transfer gate 66 may be formed on the channel layer 60. The transfer gate 66 may surround the sidewall of the pillar 56 and have an opening 68 exposing the channel layer 60. The transfer gate 66 may include a gate dielectric layer 62 which is formed on the channel layer 60 and a gate electrode 64 which is formed on the gate dielectric layer 62. The gate dielectric layer 62 may include any one or at least two selected from the group consisting of an oxide, a nitride and an oxynitride. The gate electrode 64 may include a semiconductor material or a metallic material. The opening 68 may be formed to expose the channel layer 60 which is formed on the top surface of the pillar 56.

The transfer gate 66 may be formed through a series of processes of forming a dielectric layer on the surface of the structure including the channel layer 60, forming a conductive layer covering the pillar 56 on the dielectric layer and then etching selectively the conductive layer and the dielectric layer.

Meanwhile, the channel layer 60 may be patterned in the process for forming the transfer gate 66. Accordingly, the outer sidewall of the channel layer 60 may be aligned with the outer sidewall of the transfer gate 66.

Figure 6E:
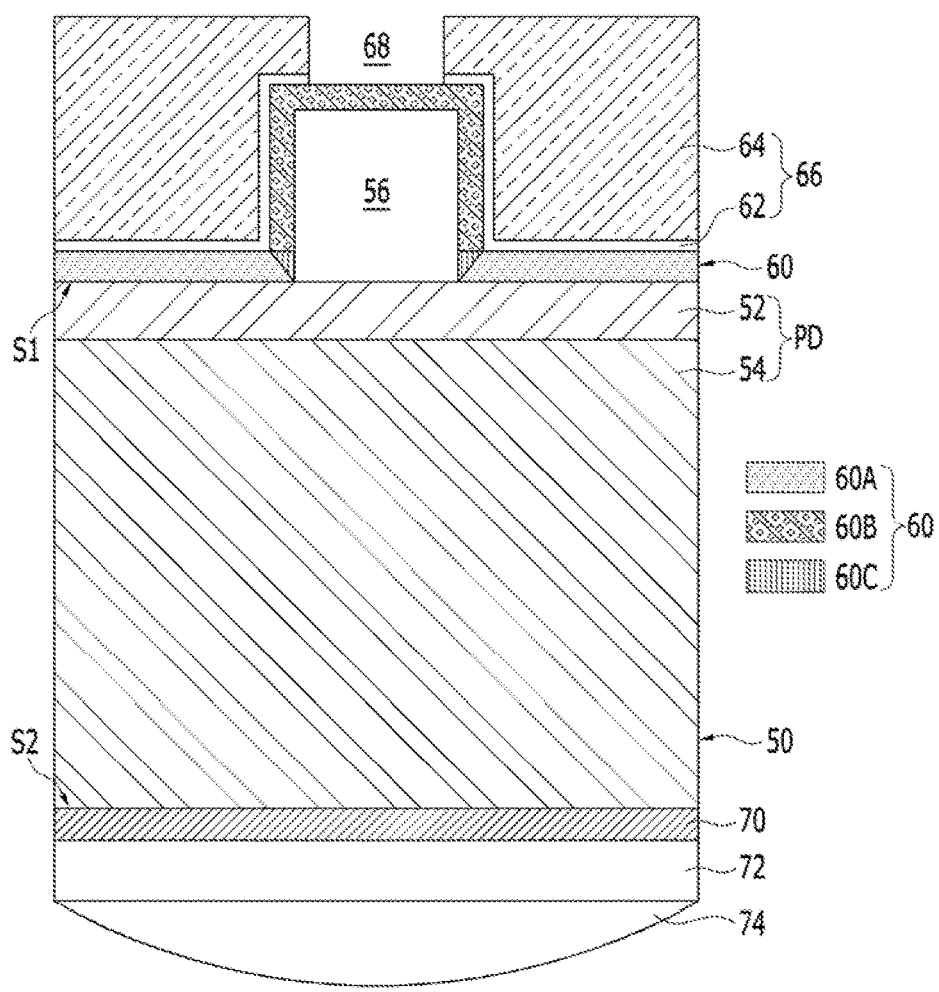

As shown in FIG. 6E, a charge trap layer 70 may be formed on the second surface S2 of the substrate 50. The charge trap layer 70 may include a silicon-containing material which has a single crystalline state, and may be doped with a high concentration of a predetermined impurity. The charge trap layer 70 may have the same crystal plane as the crystal plane of the second surface S2 of the substrate 50. For instance, the charge trap layer 70 may have a crystal plane having a Miller index of (100), and include a single crystalline silicon layer which is doped with a P-type impurity.

While not shown in the drawing, the charge trap layer 70 may be formed by applying the above-described process for forming the channel layer 60. For example, a P-type impurity region may be formed by implanting a P-type impurity into the second surface S2 of the substrate 50. The P-type impurity region may be formed to have an impurity doping concentration larger than the saturated solids solubility for the impurity in the substrate 50. Then, an amorphous silicon layer may be deposited on the second surface S2 of the substrate 50, as a pre-charge trap layer. Thereupon, a low temperature annealing process may be performed. In the low temperature annealing process, as a recrystallization is performed by using the second surface S2 of the substrate 50 as a seed and at the same time the P-type impurity in the P-type impurity region is diffused, a single crystalline silicon layer doped with the P-type impurity may be formed and at the same time a defect on the second surface S2 of the substrate 50 may be removed.

Next, a color separation element 72 and a light focusing element 74 may be formed sequentially on the charge trap layer 70.

Thereafter, the image sensor may be completely fabricated through a processing method known in the art.

Figure 7:
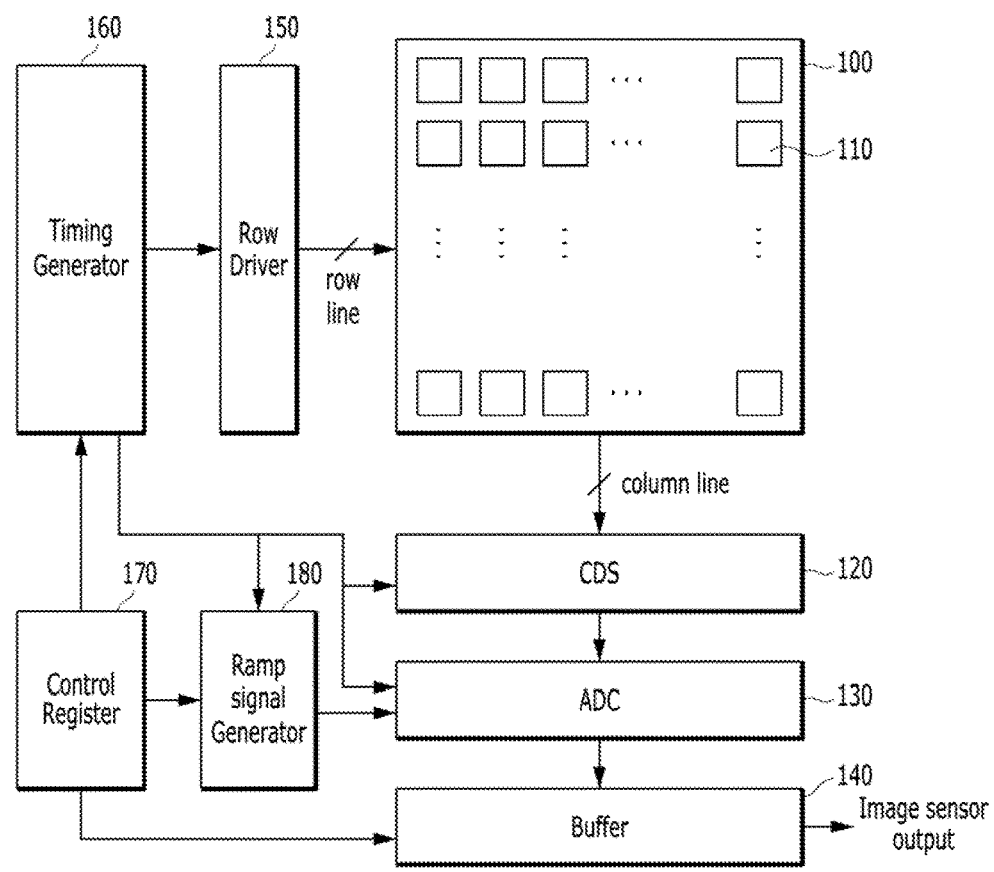
FIG. 7 is a block diagram illustrating an exemplary configuration of an image sensor, in accordance with an embodiment of the present invention.

FIG. 7 is a block diagram illustrating an image sensor in accordance with an exemplary embodiment of the present invention. As illustrated in FIG. 7, the image sensor may include a pixel array 100, a correlated double sampling (CDS) unit 120, an analog-digital converter (ADC) 130, a buffer 140, a row driver 150, a timing generator 160, a control register 170, and a ramp signal generator 180. The pixel array 100 may include a plurality of unit pixels 110 arranged in a matrix. Herein, each of the plurality of unit pixels 110 may be formed according to the above-described embodiments.

The timing generator 160 may generate one or more control signals for controlling the row driver 150, the CDS unit 120, the ADC 130, and the ramp signal generator 180. The control register 170 may generate one or more control signals for controlling the ramp signal generator 180, the timing generator 160, and the buffer 140.

The row driver 150 may drive the pixel array 100 row by row. For example, the row driver 150 may generate a select signal for selecting any one row line of a plurality of row lines. Each of the unit pixels 110 may sense incident light and output an image reset signal and an image signal to the CDS unit 120 through a column line. The CDS unit 120 may perform a sampling of the image reset signal and the image signal.

The ADC 130 may compare a ramp signal outputted from the ramp signal generator 180 with a sampling signal outputted from the CDS unit 120, and output a comparison signal. According to a clock signal provided from the timing generator 160, the ADC 130 may count a level transition time of the comparison signal, and output the count value to the buffer 140. The ramp signal generator 180 may operate under control of the timing generator 160.

The buffer 140 may store a plurality of digital signals outputted from the ADC 130 and then sense and amplify the digital signals. The buffer 140 may include a memory (not illustrated) and a sense amplifier (not illustrated). The memory may store the count values. The count values may represent signals outputted from the plurality of unit pixels 110. The sense amplifier may sense and amplify the count values outputted from the memory.

The image sensor in accordance with an exemplary embodiment of the present invention may be used in various electronic devices or systems. Hereafter, a camera including an image sensor in accordance with an exemplary embodiment of the present invention will be described with reference to FIG. 8.

Figure 8:
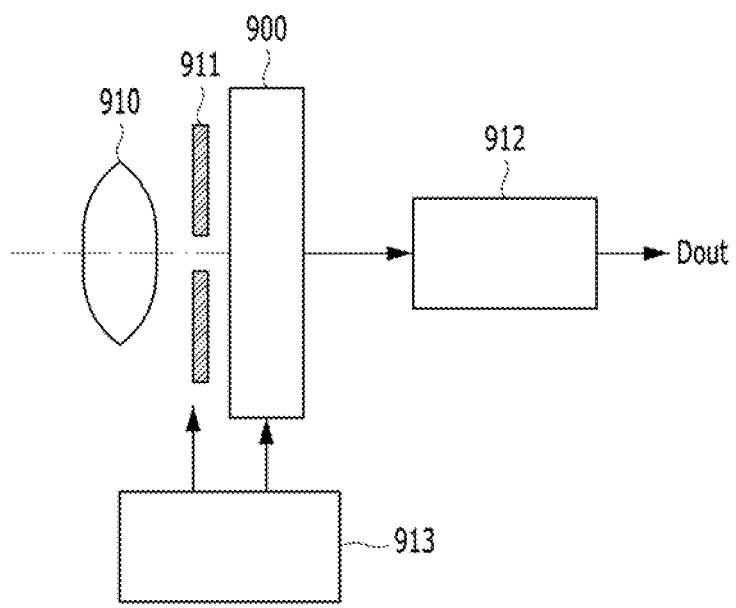
FIG. 8 is a diagram illustrating an electronic device including an image sensor, in accordance with an embodiment of the present invention.

FIG. 8 is a diagram illustrating an electronic device including an image sensor 900 in accordance with an exemplary embodiment of the present invention. Referring to FIG. 8, the electronic device including the image sensor 900 in accordance with an exemplary embodiment of the present invention may be a camera capable of capturing a still image or a moving image. The electronic device may include an optical system or optical lens 910, a shutter unit 911, a driving unit 913 for controlling/driving the image sensor 900 and the shutter unit 911, and a signal processing unit 912.

The optical system 910 may guide incident image light captured from an object to the pixel array 100 of the image sensor 900. The optical system 910 may include a plurality of optical lenses. The shutter unit 911 may control a light irradiation period and a light shield period for the image sensor 900. The driving unit 913 may control a transmission operation of the image sensor 900 and a shutter operation of the shutter unit 911. The signal processing unit 912 may process signals outputted from the image sensor 900 in various manners. The processed image signals Dout may be stored in a storage medium such as a memory or outputted to a monitor or the like.

As is apparent from the above descriptions, according to the present technology, it is possible to provide an image sensor which is easy to achieve a high degree of integration and is capable of preventing system characteristics from being degraded due to an increase in the integration degree.

Further, since the channel layer of a transfer transistor has different crystalline states for respective regions, a dark current characteristic may be improved effectively.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
    a substrate including a photoelectric conversion element;
    a transfer gate formed over the photoelectric conversion element; and
    a channel layer controlled by the transfer gate, wherein the channel layer includes a first region which is in contacts with the photoelectric conversion element and a second region which is separated from the photoelectric conversion element, and the first region and the second region have different crystalline states from each other.

2. The image sensor according to claim 1, wherein the first region has a single crystalline state, and the second region has a polycrystalline state.

3. The image sensor according to claim 2, wherein the substrate has a single crystalline state, and a crystal plane of the first region is the same as a crystal plane of a surface of the substrate.

4. The image sensor according to claim 2, wherein the channel layer further includes a third region which is positioned between the first region and the second region, and the third region has a single crystalline state and a crystal plane different from the crystal plane of the first region.

5. The image sensor according to claim 1, wherein the photoelectric conversion element has a shape in which a first impurity region and a second impurity region formed in the substrate and having different conductivity types are stacked vertically, the first region of the channel layer contacts with the first impurity region, and the first impurity region has an impurity doping concentration lower than a saturated solids solubility for the first impurity.

6. The image sensor according to claim 1, wherein the channel layer includes any one selected among an undoped silicon layer, a P-type silicon layer and an N-type silicon layer.

7. An image sensor comprising:
a substrate including a photoelectric conversion element;
a first transfer gate formed over the photoelectric conversion element;
at least one opening exposing the photoelectric conversion element through the first transfer gate;
a channel layer formed in the opening; and
a second transfer gate formed over the channel layer and filling the opening,
wherein the channel layer includes a first region which is formed over a bottom surface of the opening and contacts with the photoelectric conversion element and a second region which is formed over a sidewall of the opening and is separated from the photoelectric conversion element, and the first region and the second region have different crystalline states from each other.

8. The image sensor according to claim 7, wherein the first region has a single crystalline state, and the second region has a polycrystalline state.

9. The image sensor according to claim 8, wherein the substrate has a single crystalline state, and a crystal plane of the first region is the same as a crystal plane of a surface of the substrate.

10. The image sensor according to claim 8, wherein the channel layer further includes a third region which is positioned between the first region and the second region, and the third region has a single crystalline state and has a crystal plane different from the crystal plane of the first region.

11. The image sensor according to claim 10, wherein the third region of the channel layer is formed at a corner of the bottom surface of the opening.

12. The image sensor according to claim 7, wherein the photoelectric conversion element has a shape in which a first impurity region and a second impurity region formed in the substrate and having different conductivity types are stacked vertically, the first region of the channel layer contacts with the first impurity region, and the first impurity region has an impurity doping concentration lower than a saturated solids solubility for the first impurity.

13. The image sensor according to claim 7, wherein the channel layer includes any one selected among an undoped silicon layer, a P-type silicon layer and an N-type silicon layer.

14. An image sensor comprising:
a substrate including a photoelectric conversion element;
at least one pillar formed over the photoelectric conversion element;
a channel layer covering the photoelectric conversion element and the pillar;
a transfer gate formed over the channel layer to surround a sidewall of the pillar; and
an opening exposing the channel layer through the transfer gate,
wherein the channel layer includes a first region which is formed over the substrate and contacts with the photoelectric conversion element and a second region which covers the pillar and is separated from the photoelectric conversion element, and the first region and the second region have different crystalline states from each other.

15. The image sensor according to claim 14, wherein the first region has a single crystalline state, and the second region has a polycrystalline state.

16. The image sensor according to claim 15, wherein the substrate has a single crystalline state, and a crystal plane of the first region is the same as a crystal plane of a surface of the substrate.

17. The image sensor according to claim 15, wherein the channel layer further includes a third region which is positioned between the first region and the second region, and the third region has a single crystalline state and has a crystal plane different from the crystal plane of the first region.

18. The image sensor according to claim 17, wherein the third region of the channel layer is formed at a corner of the pillar where the pillar and the substrate contact with each other.

19. The image sensor according to claim 14, wherein the opening exposes the second region of the channel layer.

20. The image sensor according to claim 14, wherein the photoelectric conversion element has a shape in which a first impurity region and a second impurity region formed in the substrate and having different conductivity types are stacked vertically, the first region of the channel layer contacts with the first impurity region, and the first impurity region has an impurity doping concentration lower than a saturated solids solubility for the first impurity.

21. The image sensor according to claim 14, wherein the channel layer includes any one selected among an undoped silicon layer, a P-type silicon layer and an N-type silicon layer.

22. A method for fabricating an image sensor, comprising:
forming a photoelectric conversion element in a substrate;
forming a pre-channel layer in amorphous state which includes a first region contacting with the photoelectric conversion element and a second region separated from the photoelectric conversion element, over the substrate including the photoelectric conversion element; and
forming a channel layer by performing a low temperature annealing process for the pre-channel layer, in such a manner that the first region and the second region have different crystalline states from each other.

23. The method according to claim 22, wherein, the forming of the photoelectric conversion element in the substrate includes stacking vertically a first impurity region and a second impurity region having different conductivity types in the substrate, and the first impurity region which contacts with the first region of the channel layer is formed to have an impurity doping concentration lower than a saturated solids solubility for the impurity.

24. The method according to claim 22, wherein the forming of the pre-channel layer is performed at a temperature lower than in the low temperature annealing process.

25. The method according to claim 22, wherein the low temperature annealing process is performed at a temperature ranging from about 550° C. to about 600° C.

26. The method according to claim 22, wherein, the low temperature annealing process recrystallizes the first region from an amorphous state to a single crystalline state, and recrystallizes the second region from an amorphous state into a polycrystalline state.

27. The method according to claim 26, wherein the substrate has a single crystalline state, and a crystal plane of the first region is the same as a crystal plane of a surface of the substrate.

28. The method according to claim 26, wherein the channel layer further includes a third region which is positioned between the first region and the second region, and the third region has a single crystalline state and has a crystal plane different from the crystal plane of the first region.

29. The method according to claim 22, wherein the channel layer includes any one selected among an undoped silicon layer, a P-type silicon layer and an N-type silicon layer.

* * * * *